(12) United States Patent
Gupta et al.

(10) Patent No.: US 10,446,219 B2
(45) Date of Patent: Oct. 15, 2019

(54) MEMORY DEVICE AND METHODS FOR CONTROLLING A MEMORY ASSIST FUNCTION

(71) Applicant: Infineon Technologies AG, Neubiberg (DE)

(72) Inventors: Siddharth Gupta, Munich (DE); Gunther Lehmann, Holzkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/847,972

(22) Filed: Dec. 20, 2017

(65) Prior Publication Data

US 2018/0174640 A1 Jun. 21, 2018

(30) Foreign Application Priority Data

Dec. 20, 2016 (DE) .................. 10 2016 124 962

(51) Int. Cl.
| | |
|---|---|
| *G11C 11/419* | (2006.01) |
| *G11C 11/4091* | (2006.01) |
| *G11C 11/4074* | (2006.01) |
| *G11C 7/04* | (2006.01) |
| *G11C 11/418* | (2006.01) |

(Continued)

(52) U.S. Cl.
CPC ............ *G11C 11/4091* (2013.01); *G11C 7/04* (2013.01); *G11C 11/4074* (2013.01); *G11C 11/413* (2013.01); *G11C 11/418* (2013.01); *G11C 8/08* (2013.01); *G11C 11/419* (2013.01)

(58) Field of Classification Search
CPC .................. G11C 11/419; G11C 7/22
USPC ............................ 365/154, 189.05
See application file for complete search history.

(56) References Cited

U.S. PATENT DOCUMENTS

| | | | | |
|---|---|---|---|---|
| 5,218,571 A | * | 6/1993 | Norris | G11C 16/12 365/185.11 |
| 5,898,618 A | * | 4/1999 | Lakkapragada | G11C 16/30 327/530 |

(Continued)

FOREIGN PATENT DOCUMENTS

DE 102015105413 A1 10/2015

OTHER PUBLICATIONS

Takeda et. al.: "Multi-Step Word-Line Control Technology in Hierarchical Cell Architecture for Scaled-Down High-Density SRAMs", IEEE Journal of Solid-State Circuits, Apr. 2011, vol. 46, No. 4.

(Continued)

*Primary Examiner* — Michael T Tran
(74) *Attorney, Agent, or Firm* — Viering, Jentschura & Partner MBB

(57) ABSTRACT

According to one embodiment, a memory device is described including a memory array including a plurality of memory cells wherein each memory cell is coupled to a control line, a memory assist circuit configured to, when activated, apply a reduction of a voltage of the control line, a signal generator configured to generate a signal representing at least one of a process corner of the memory device, a supply voltage of the memory device, a temperature of the memory device and an aging of the memory device, a signal processing circuit configured to amplify the signal and a controller configured to activate the memory assist circuit based the amplified signal.

20 Claims, 30 Drawing Sheets

(51) Int. Cl.
*G11C 11/413* (2006.01)
*G11C 8/08* (2006.01)

(56) References Cited

U.S. PATENT DOCUMENTS

| | | | | |
|---|---|---|---|---|
| 6,356,485 B1* | 3/2002 | Proebsting | ............ | G11C 7/065 365/189.16 |
| 6,373,753 B1* | 4/2002 | Proebsting | ............ | G11C 5/145 257/E21.659 |
| 6,462,584 B1* | 10/2002 | Proebsting | ............ | G11C 7/065 257/E21.659 |
| 6,462,998 B1* | 10/2002 | Proebsting | ............... | G11C 7/04 257/E21.659 |
| 7,486,540 B2 | 2/2009 | Gouin et al. | | |
| 7,508,697 B1* | 3/2009 | Mukhopadhyay | ..... | G11C 29/02 365/154 |
| 7,627,839 B1* | 12/2009 | Chan | ................ | H03K 3/356113 327/100 |
| 7,634,746 B1* | 12/2009 | Chan | ................... | G06F 17/5036 323/274 |
| 7,675,792 B2* | 3/2010 | Bedeschi | ............... | G11C 5/147 365/185.2 |
| 8,924,897 B2* | 12/2014 | Oishi | ...................... | G03F 1/144 716/56 |
| 8,982,651 B2 | 3/2015 | Grover et al. | | |
| 9,160,348 B2* | 10/2015 | Jung | ...................... | H03K 3/0315 |
| 9,182,768 B2* | 11/2015 | Smith | ...................... | G05F 1/462 |
| 9,235,678 B2* | 1/2016 | Moughabghab | ...... | G06F 17/505 |
| 9,601,165 B1* | 3/2017 | Dray | ...................... | G11C 7/065 |
| 9,825,638 B2* | 11/2017 | Dumchin | ............... | G01R 31/28 |
| 9,964,977 B2* | 5/2018 | Tseng | ...................... | G05F 1/59 |
| 2004/0160838 A1* | 8/2004 | Pelley | .................. | G11C 7/1045 365/222 |
| 2004/0179414 A1* | 9/2004 | Hsu | .......................... | G11C 7/04 365/211 |
| 2005/0052919 A1* | 3/2005 | Chou | .................... | G11C 11/406 365/222 |
| 2005/0169078 A1 | 8/2005 | Balasubramanian et al. | | |
| 2005/0226031 A1* | 10/2005 | Najm | .................... | G11C 7/062 365/154 |
| 2006/0010350 A1* | 1/2006 | Pelley | ..................... | G11C 7/04 714/42 |
| 2006/0289862 A1* | 12/2006 | Yoshida | .................. | G06F 1/206 257/48 |
| 2007/0098042 A1* | 5/2007 | Choi | ....................... | G01K 7/015 374/170 |
| 2007/0120583 A1* | 5/2007 | Lam | ...................... | H03L 7/0802 327/156 |
| 2009/0086554 A1 | 4/2009 | Chanussot et al. | | |
| 2009/0109785 A1 | 4/2009 | Houston et al. | | |
| 2010/0103726 A1* | 4/2010 | Bae | ........................ | G11C 5/143 365/163 |
| 2010/0110815 A1* | 5/2010 | Lee | ......................... | G11C 5/143 365/211 |
| 2010/0265779 A1* | 10/2010 | Cano | ........................ | G11C 7/08 365/194 |
| 2011/0069572 A1* | 3/2011 | Lee | ......................... | G11C 11/406 365/222 |
| 2013/0093505 A1* | 4/2013 | Gupta | ..................... | G05F 1/575 327/540 |
| 2013/0308397 A1* | 11/2013 | Kohli | ..................... | G11C 11/419 365/189.15 |
| 2013/0308399 A1* | 11/2013 | Kohli | ..................... | G11C 7/227 365/189.16 |
| 2014/0218101 A1* | 8/2014 | Ham | ........................ | G05F 1/463 327/540 |
| 2015/0276500 A1* | 10/2015 | Walker | ..................... | G01K 7/16 365/189.011 |
| 2015/0294700 A1 | 10/2015 | Jefremow et al. | | |
| 2015/0325279 A1* | 11/2015 | Roizin | .................. | G11C 11/161 365/158 |
| 2016/0041212 A1* | 2/2016 | Darbinyan | ......... | G01R 29/0273 327/33 |
| 2016/0071554 A1* | 3/2016 | Hong | ..................... | G11C 5/147 365/189.09 |
| 2016/0093399 A1* | 3/2016 | Gupta | .................... | G11C 29/04 365/189.07 |
| 2017/0092343 A1* | 3/2017 | Palmer | ................ | G06F 13/1689 |
| 2018/0287570 A1* | 10/2018 | Nilsson | ..................... | H03F 1/52 |

OTHER PUBLICATIONS

Sharma et al., "Adaptive voltage optimization techniques: low voltage SRAM operation", in: "SRAM Design for Wireless Sensor Networks", 2013, p. 31-43, Springer Science + Business Media, New York.

Fischer et al.: "A 65nm test structure for the analysis of NBTI induced statistical variation in SRAM transistors", 2008, p. 51-54. ESSDERC 2008—Proceedings of the 38th European Solid-State Device Research Conference.

\* cited by examiner

MEMORY DEVICE AND METHODS FOR CONTROLLING A MEMORY ASSIST FUNCTION

CROSS-REFERENCE TO RELATED APPLICATION

This application claims priority to German Patent Application Serial No. 10 2016 124 962.9, which was filed Dec. 20, 2016, and is incorporated herein by reference in its entirety.

TECHNICAL FIELD

The present disclosure relates to memory devices and methods for controlling a memory assist function.

BACKGROUND

With decreasing feature sizes the variation of threshold voltages of field effect transistors used in memories is increasing due to increasing variations in semiconductor manufacturing. This typically deteriorates the stability and writability of memory cells. Accordingly, approaches are desirable which allow a reliable operation of high-density memory cells.

SUMMARY

According to one embodiment, a memory device is provided including a memory array including a plurality of memory cells wherein each memory cell is coupled to a control line, a memory assist circuit configured to, when activated, apply a reduction of a voltage of the control line, a signal generator configured to generate a signal representing at least one of a process corner of the memory device, a supply voltage of the memory device, a temperature of the memory device and an aging of the memory device, a signal processing circuit configured to amplify the signal and a controller configured to activate the memory assist circuit based the amplified signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
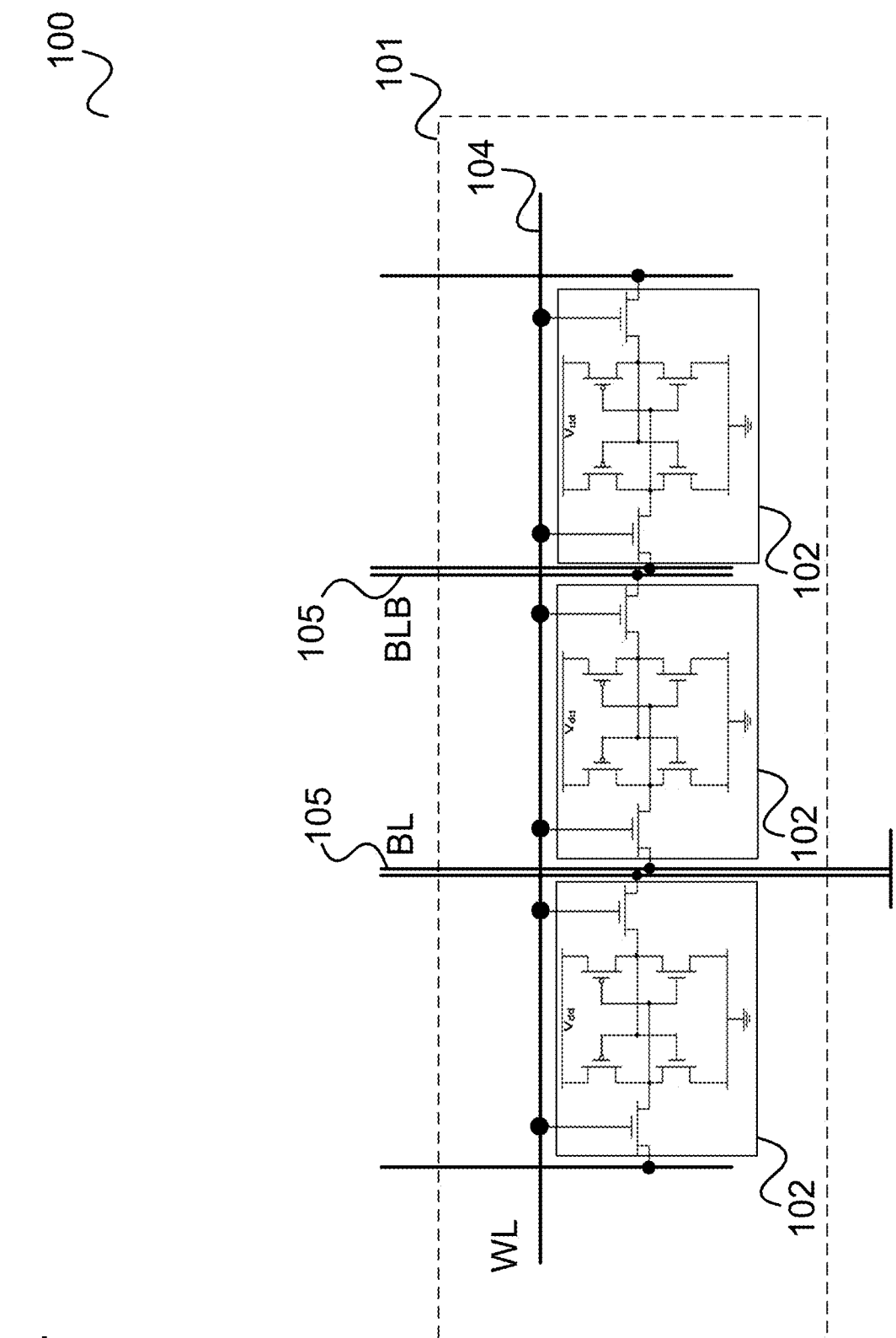
FIG. 1 shows a memory device.

FIG. 1 shows a memory device 100.

The memory device 100 includes a memory array 101 including SRAM cells 102, wherein each memory cell 102 is connected to a word line 104 and arranged between two complementary bit lines 105.

With decreasing feature sizes, the variation of threshold voltages (Vth) of e.g. field effect transistors of the memory cells 102 is increasing due to increasing variations in semiconductor manufacturing. This is deteriorating the stability (often characterized by the static noise margin, SNM) and/or writability (often characterized by the write margin, WM) of SRAM cells 102 and thereby limits in particular the usage of SRAM cells 102 at low voltages, e.g. of the word line 104 or the bit line the 105. Furthermore, high temperatures which may for example be required for automotive products are limiting the cell features even more. Accordingly, circuit techniques are desirable which enable a reliable operation of high-density SRAM cells (e.g. around 0.13 um$^2$ in 28 nm CMOS technologies) at low voltages (e.g. 0.8V) and high temperatures (e.g. 170° C.) while providing high performance of the corresponding memory macros (e.g. 500 MHz).

The usage of SRAM cells with increased device sizes reduces the variations but leads to an intolerable area and leakage current penalty. The usage of an 8T-SRAM cell with separate read stack cell allows an independent optimization of SRAM cell stability and read speed but again leads to a significant area leakage current penalty and is often not suitable for area-efficient SRAMs which are using a bit line multiplexer circuit.

A reduction of the word-line high voltage (e.g. from 1V to 0.9V) improves the stability of the SRAM cell but reduces the read times of an SRAM since the read current of the SRAM cell is negatively impacted by the reduced word line voltage. Also, the reduction of the word line voltage deteriorates the writability of an SRAM cell as the access devices to the SRAM latch have a reduced conductivity if the word line voltage is reduced. To compensate this negative effect, so-called write assist circuits may be used improve the writability of an SRAM cell bit line voltages may be lowered (negative bit line, NBL, e.g. –100 mV on a bit line instead of 0V) during a write operation to improve the writability. However, applying write assist circuits are leading to additional area, higher active power consumption and/or deteriorated memory timings.

In the following, embodiments are described in which one or more Process/Voltage/Temperature/Aging (PVTA) controlled assist circuits are included in a memory device to improve the stability and/or the writability of memory cells within the memory device whereby the activation or de-activation of at least one of the assist circuits is controlled by at least one parameter depending on a process, voltage, temperature or aging (also referred to as deterioration) property. The memory device could be e.g. an SRAM, a Dual-Port SRAM, a Multi-Port SRAM, a DRAM (dynamic RAM), a flash memory, a resistive RAM, an STT-MRAM (spin-transfer torque magnetic RAM), a PC-RAM (phase-change RAM), a CB-RAM (conductive bridging RAM), or a ROM (read-only memory).

Figure 2:
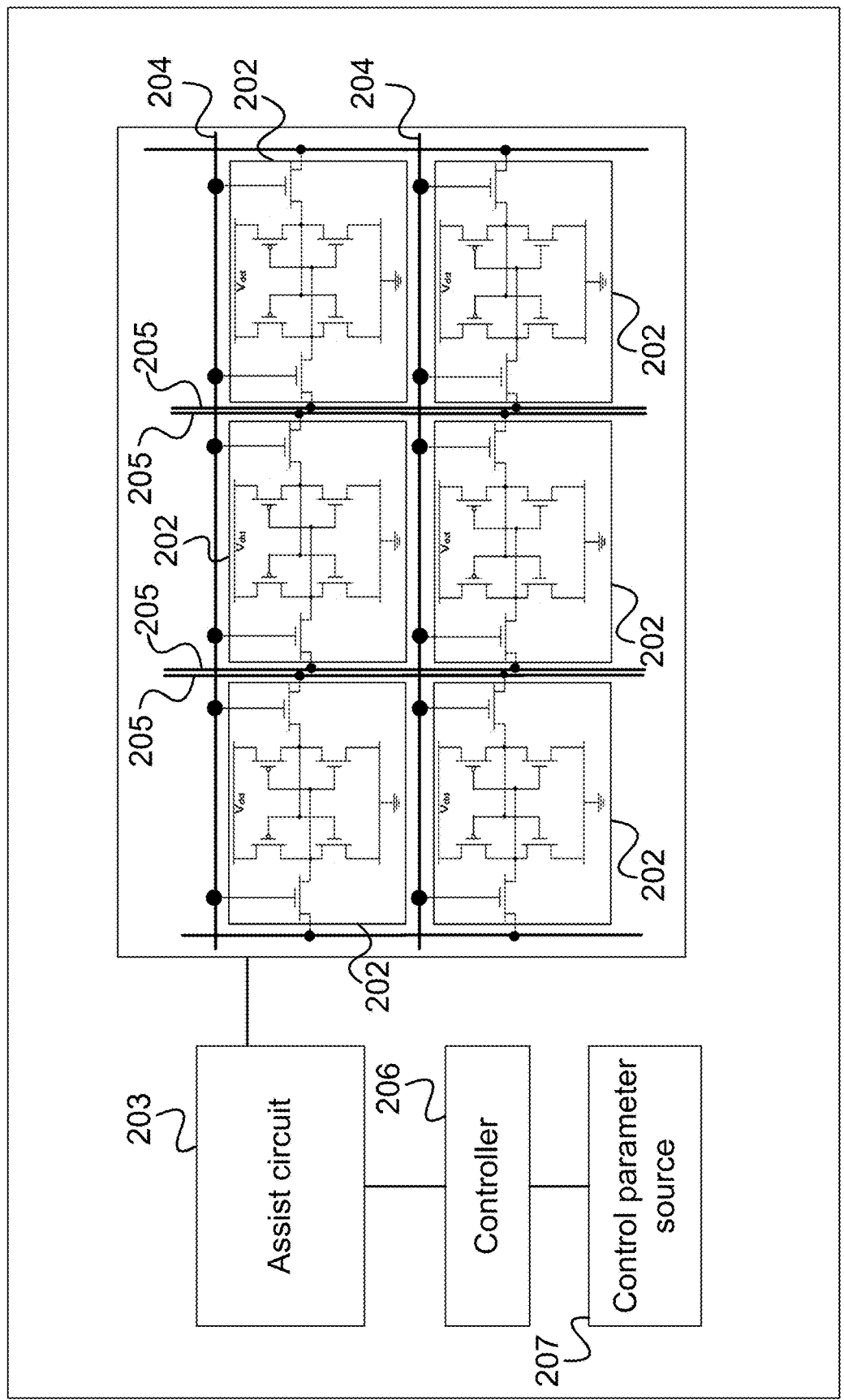
FIG. 2 shows a memory device according to an embodiment.

FIG. 2 shows a memory device 200 according to an embodiment.

The memory device 200 includes a memory array 201 as described above with reference to FIG. 1 including memory cells 202 coupled to word lines 204 and bit lines 205.

The memory device 200 further includes an assist circuit 203 and a controller 206 controlling the assist circuit 203. Under control of the controller 206, the access circuit 202 for example reduces the voltage of the word lines 204 to increase stability of the cells 202 or reduces the voltage of the bit lines to improve writability of the cells 202.

The controller 206 may control the assist circuit 203 to perform a bit line voltage reduction or a word line voltage reduction based on input (or control) parameters including one or more of parameters indicating a process corner of the memory device 200, a supply voltage of the memory device 200, a temperature of the memory device 200 and an aging of the memory device 200 which it receives from a control parameter source 207, e.g. one or more sensors sensing one or more of the control parameters or a memory storing one or more of the control parameters (e.g. stored based on results of previous measurements, e.g. a process corner determination performed in the factory). The control parameter source 207 may for example generate the control parameter based on a signal, e.g. a sensor signal, representing at least one of the process corner of the memory device 200, the supply voltage of the memory device 200, the temperature of the memory device 200 and the aging of the memory device 200, e.g. by amplifying the signal and digitizing the signal.

For example, the controller 206 controls the assist circuit 203 (or a plurality of assist circuits) according to one or more of the following:

A word line voltage reduction improving the stability of an SRAM cell 202 is activated when the supply voltage of the SRAM cell 202 is below a pre-defined voltage level.

A word line voltage reduction improving the stability of an SRAM cell 202 is activated when the supply voltage of the SRAM cell 202 is exceeding a pre-defined voltage level.

A word line voltage reduction improving the stability of an SRAM cell 202 is de-activated when the supply voltage of the SRAM cell 202 is above a $1^{st}$ pre-defined voltage level and below a $2^{nd}$ pre-defined voltage level.

A bit line voltage reduction during a write operation improving the writability of an SRAM 202 cell is activated when the temperature inside or close to the memory device 200 is below a pre-defined temperature level.

A bit line voltage reduction during a write operation improving the writability of an SRAM cell 202 is activated when a parameter depending on a process property is below or above a pre-defined level. For example, an indicator device could provide a signal which assumes a high voltage level when the process is in a so-called fast corner for the SRAM PFET devices (i.e. the p channel field effect transistors of the memory device 200). This high voltage level activates the write assist circuit.

A word line voltage reduction improving the stability of an SRAM cell is activated when an aging indicator device indicates that aging of one or more SRAM cell devices has reached a certain pre-defined level. For example, the control parameter source 207 in the form of an aging indicator device indicates that the threshold voltage of the PFET devices inside the SRAM cells has increased due to NBTI (Negative Bias Temperature Instability)-related aging to a certain voltage level. The aging indicator device might include additional dummy SRAM cells or additional dummy SRAM cell devices employed to emulate the aging of the SRAM cells of the memory device.

The activation or de-activation of an assist circuit may depend on more than one parameter. E.g. a word line voltage reduction improving the stability of an SRAM cell is activated only when a $1^{st}$ parameter depending on the conductivity of the SRAM PFET devices is below a pre-defined process level, a $2^{nd}$ parameter depending on the SRAM supply voltage is below a pre-defined voltage level, and a $3^{rd}$ parameter depending on a temperature inside or close to the memory device 200 is above a pre-defined temperature level.

Various embodiments can be seen to be based on the fact that assist circuits are often only needed when PVTA parameters are within (or outside) a certain range. Thereby, these embodiments can improve the timing of a memory device, reduce its power consumption, improve its manufacturing yield, its reliability or improve the operating voltage and temperature range.

For example, stability assist circuits are often only beneficial when the temperature is above a certain value. At lower temperatures, a stability assist circuit does not improve the stability but it still has a negative impact on the drive strength of an SRAM cell, i.e. it has negative impact on the access time of the memory device 200. This negative impact is avoided according to an embodiment including a temperature-based activation of a stability assist circuit. This may in particular be useful for advanced technology nodes, like 40 nm or 28 nm technologies, where the timing critical temperature is often at very low temperatures, like −40° C. Simulations in advanced technologies confirm that the timing of a memory device could be deteriorated by up to 50% if a word line reduction is active at all voltages and temperatures. In addition, if the timing is improved, active power consumption may be reduced as the bit lines are discharged less during a read or write operation.

Thus, if a PVTA-controlled stability assist circuit is applied, an additional writability assist circuit might not be required. Accordingly, the area and power consumed by the writability assist circuit can be saved. Furthermore, as NBL (negative bit line) circuits increase the voltage stress as they provide voltage outside the normal operating range, e.g. −0.3V on a bit line vs. 0.0V on a bit line, by avoiding the need for an NBL circuit voltage stress can be reduced and reliability can be improved.

As a further example, a write (or writability) assist circuit is often only beneficial when the memory device's temperature is below a certain value. At higher temperatures, a writability assist circuit may not improve the writability but still have negative impact on the power consumption of the memory device 200. According to an embodiment including a temperature-based activation of a write assist circuit this negative impact can be avoided as the writability assist circuit is de-activated at higher temperatures. This may in particular be useful for automotive applications requiring operation at high temperatures while keeping power consumption at reasonable levels.

Embodiments may enable the usage of the smallest bitcell available for the technology platform, thereby bringing in huge amount of area saving for a semiconductor product (e.g. 20% area saving by using a 0.250 um² bit cell vs. a 0.300 um² bit cell in a 40 nm technology). Also, embodiments may allow using an existing memory cell beyond its qualified use conditions (e.g. at a temperature of 160° C. instead of 120° C., or at a voltage of 0.7V instead of 0.8V) without spending the time and resources to develop, qualify and maintain a dedicated memory cell which would meet those extended conditions.

Figure 3:
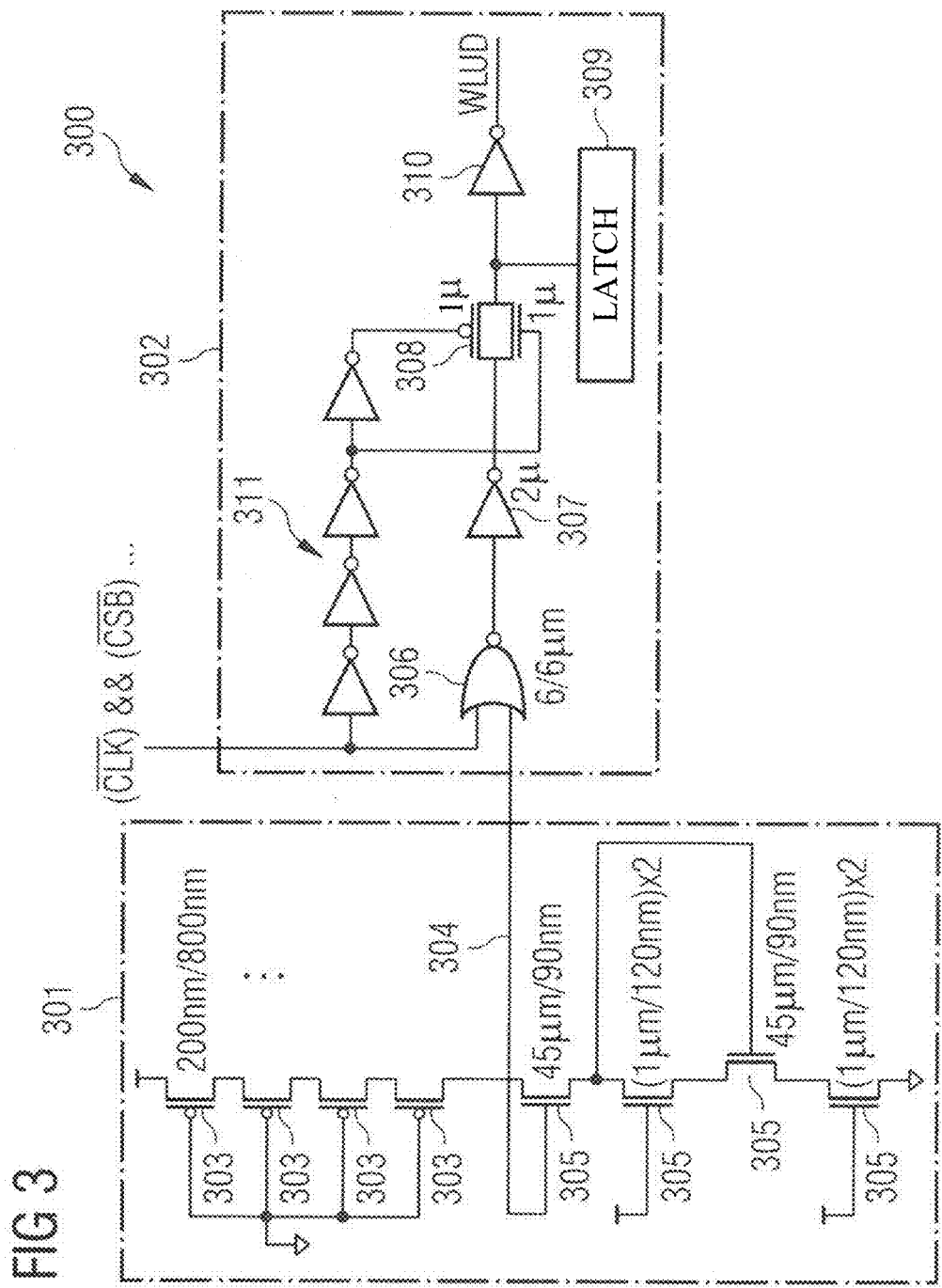
FIG. 3 shows a control arrangement for word line voltage reduction based on the temperature of a memory device.

FIG. 3 shows a control arrangement 300 for word line voltage reduction based on the temperature of a memory device.

The control arrangement 300 includes a temperature sensor 301 and a control circuit 302. The control arrangement 300 for example corresponds to the arrangement of control parameter source 207 and controller 206 of FIG. 2.

The temperature sensor 301 includes a serial connection of four p channel field effect transistors (pFETs) 303 connected between a high supply potential and an output node 304 of the temperature sensor, wherein the gates of the pFETs are connected to a low supply potential (i.e. ground). Further, a serial connection of four n channel field effect transistors (nFETs) 305 is connected between the output node 304 and the low supply potential, wherein the gate of the first nFET 305 is connected to the output node 304, the gates of the second nFET 305 and the fourth nFET 305 are connected to the high supply potential and the gate of the third nFET 305 is connected to the node of connection between the first nFET 305 and the second nFET 305. The temperature sensor 301 thus generates a temperature signal at its output. For example, the level of the temperature signal gets higher when the temperature of the memory device gets higher.

The control circuit 302 includes a NOR gate 306 which receives the temperature signal from the temperature sensor 301 as well as a timing signal at its input. The output of the NOR gate 306 is fed to a first inverter 307 and, via a transmission gate 308 whose gates receive the timing signal via an inverter delay chain 311, to a latch 309 as well as a second inverter 310 whose output is the output of the control circuit 302. The output of the control circuit 302 is for example supplied as control signal WLUD (Word Line Under Drive) to the assist circuit 203 which is in this example a stability assist circuit reducing, if activated, the word line voltage.

The control signal WLUD (Word Line Under Drive) is only activated (driven high) when the temperature sensor 301 indicates the need for the activation of the stability assist circuit. The latch 309 is used to provide a stable WLUD signal for the duration of a memory read or write access. The input to the latch 309 is gated by means of the transmission gate 308 by a timing signal which may be a function of a clock signal CLK and/or a chip select signal CSB.

Examples for dimensions of the transistors are given in FIG. 3 in the format width/length.

For example, if the temperature is above a certain threshold and thus the level of the temperature signal is above a certain threshold, the NOR 306 gate outputs (if enabled by a low level of the timing signal) a high pulse (which can be seen as an amplified and digitized version of the temperature signal) which is output via the two inverters 307, 310 to activate the stability assist circuit 203.

Despite controlling the WLUD signal by temperature, the example of FIG. 3 can be seen to also control the WLUD signal by an aging parameter: If the pFET devices 303 within the temperature sensor are degrading, i.e. increasing their threshold voltage, the WLUD signal is activated (driven high) already at a lower temperature. Accordingly, the stability of the SRAM cells 202 might not be impacted by aging of pFET devices in general, as the stability assist circuit 203 is activated at a lower temperatures once the pFETs 303 inside the temperature sensor are indicating that aging has occurred.

Figure 4:
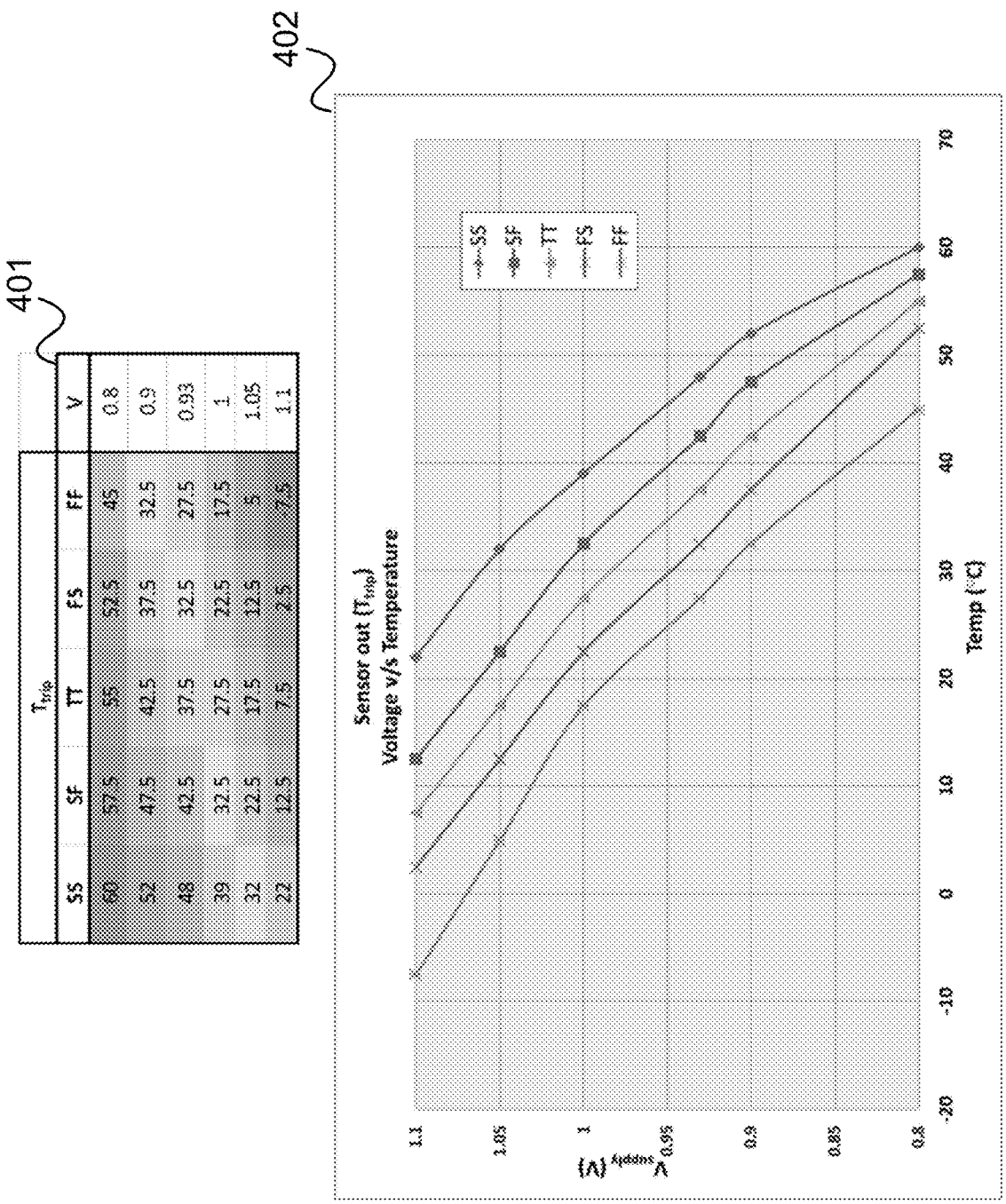
FIG. 4 shows a table giving trip points and a graphical representation of the values of the table.

FIG. 4 shows a table 401 giving trip points (as pairs of temperature and supply voltage) and a graphical representation 402 of the values of the table. The values are given for five process corners referred to as SS, SF, TT, FS, FF wherein the first letter indicates a fast (F), slow (S) or typical (T) process corner for the nFETs in the memory device 200 and the second letter indicates a fast (F), slow (S) or typical (T) process corner for the pFETs in the memory device 200.

According to an embodiment, the temperature sensor can be seen to give a temperature and voltage-based control of the assist circuit.

It can be seen that even though the temperature sensor 301 can be implemented in a very area-effective manner, the trip point proves to be relatively stable over a wide range of process and voltage conditions.

The control arrangement 300 may be adapted to control both a stability assist circuit by means of the WLUD signal as well as a writability assist circuit (e.g. also provided in the memory device 200) by means of a NBL (negative bit line assist) signal which may for example be generated from the WLUD signal by an additional inverter. This results in a control of two assist circuits by a voltage and a temperature dependent parameter as illustrated in FIG. 5.

Figure 5:
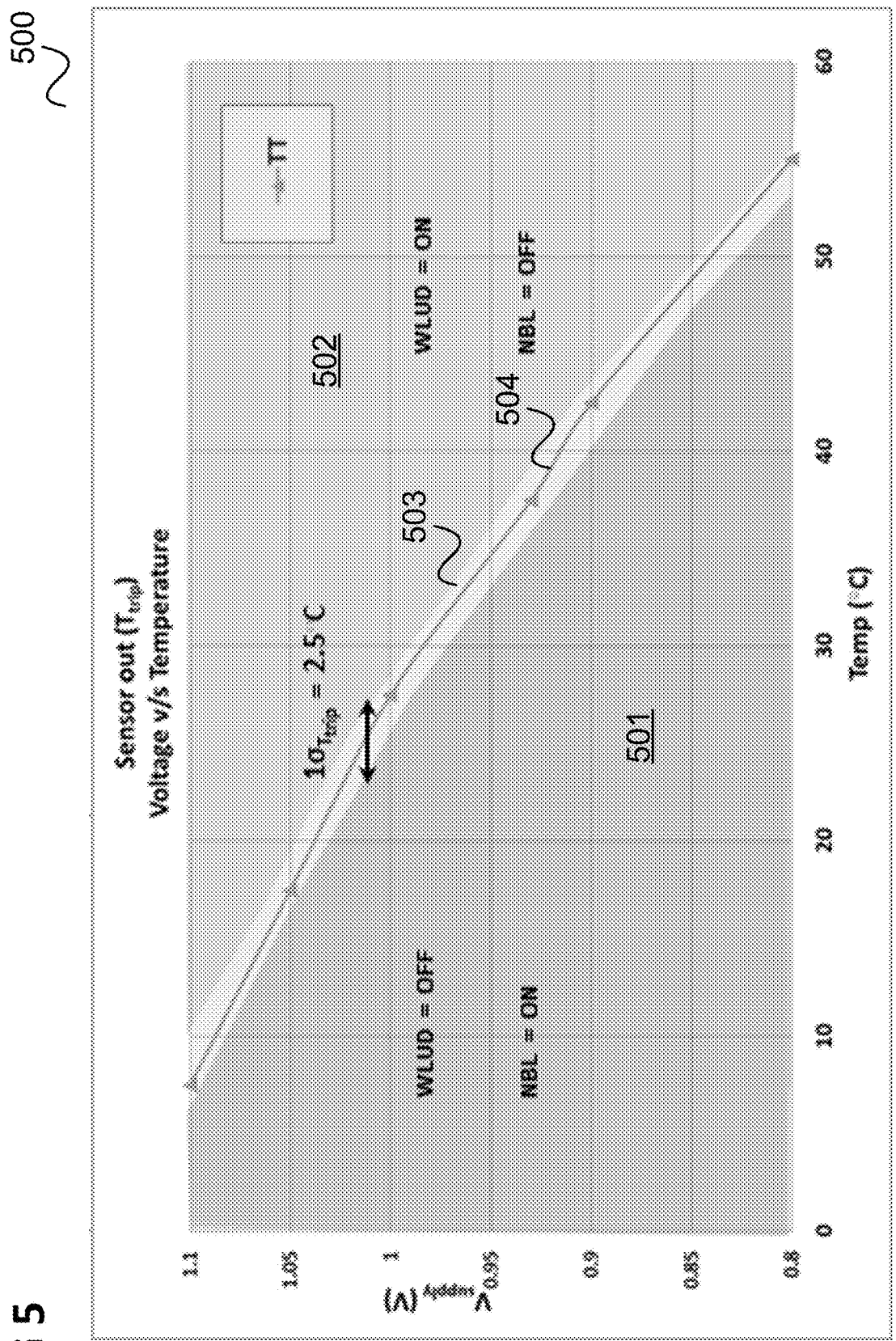
FIG. 5 shows a voltage-temperature diagram illustrating an embodiment.

FIG. 5 shows a voltage-temperature diagram 500 illustrating an embodiment.

The writability circuit (NBL) is activated and stability assist circuit (WLUD) is de-activated at low temperatures indicated by a first control region 501. At high temperatures, NBL is de-activated and WLUD is activated as indicated by a second control region 502.

Between the control regions, a small 1-Sigma interval 503 around the trip point curve 504 (in this example generated based on 300 Monte Carlo simulations) shows the robustness of the implementation.

Figure 6:
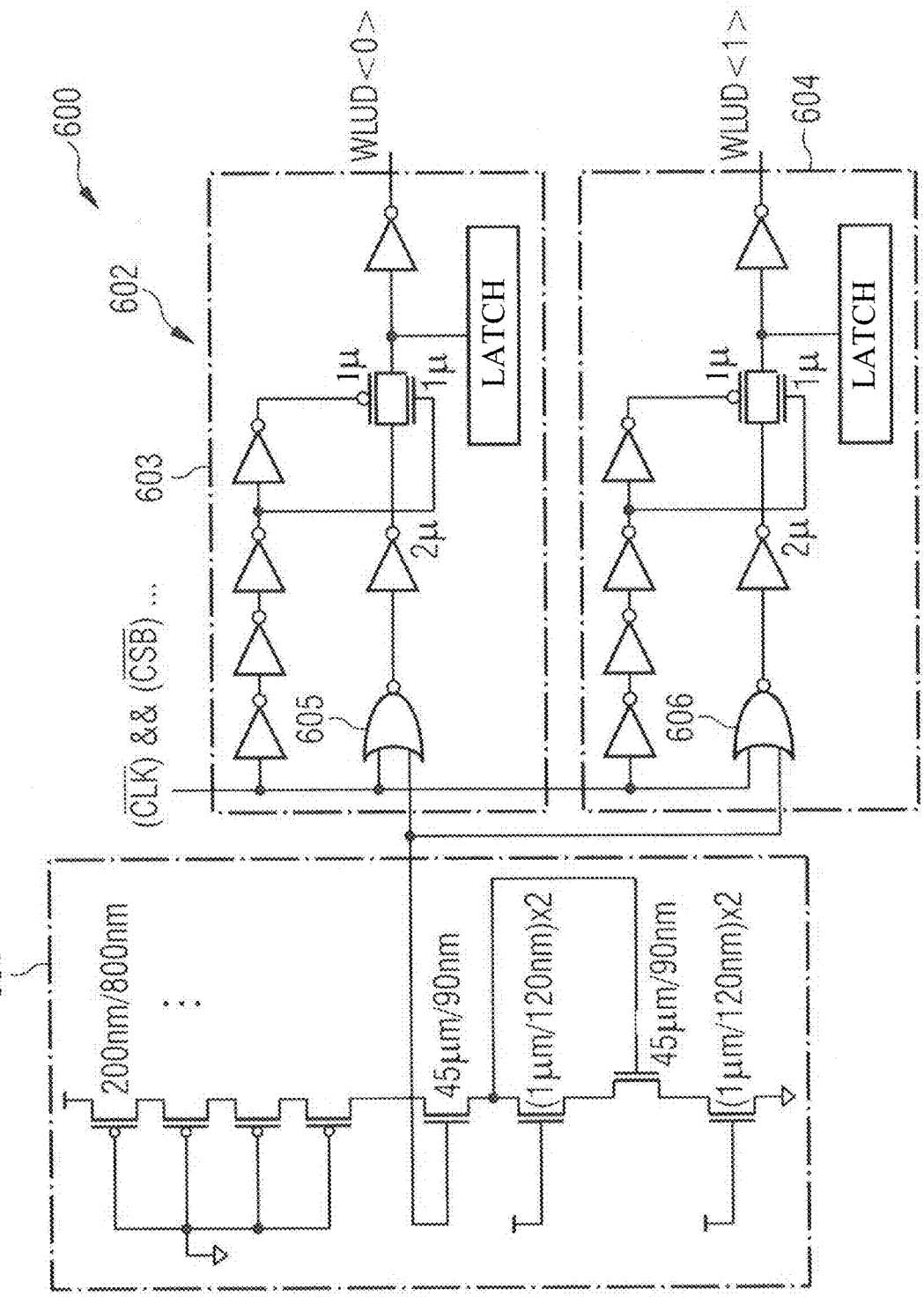
FIG. 6 shows a control arrangement for a two-step word line voltage reduction based on the temperature of a memory device.

FIG. 6 shows a control arrangement 600 for a two-step word line voltage reduction based on the temperature of a memory device.

The control arrangement 600 includes a temperature sensor 601 like the temperature sensor 301 and a control circuit 602. The control circuit 602 includes two latch circuits 603, 604 which are each similar to the control circuit 302. Thus, the temperature sensor 601 drives two separate latch circuits wherein the first latch circuit 603 outputs a signal WLUD<0> and the other latch circuit 604 outputs a signal WLUD<1>. The input stages (i.e. the NOR gates 605, 606) of the latch circuits 603, 604 are tuned differently such that WLUD<0> is activated at a different temperature as WLUD<1>.

Examples for dimensions of the transistors are given in FIG. 6 in the format width/length.

Figure 7:
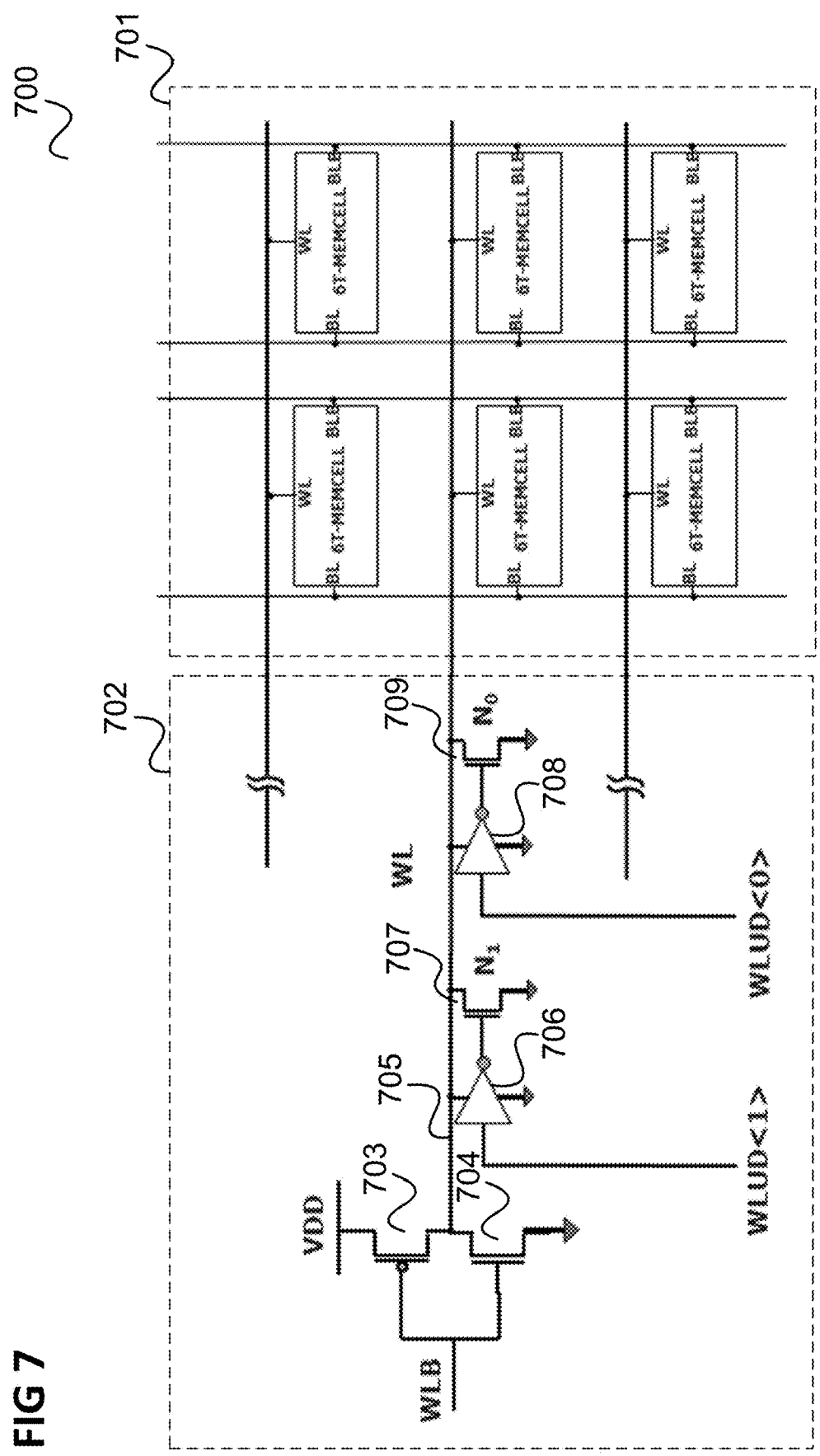
FIG. 7 shows a memory arrangement according to an embodiment.

The temperature and aging controlled WLUD signals WLUD<0>, WLUD<1> are for example used to control the voltage applied to a word line 204 of memory cells 202 during a read or write access as illustrated in FIG. 7.

FIG. 7 shows a memory arrangement 700 according to an embodiment.

The memory arrangement 700 includes a memory cell arrangement 701 for example corresponding to the memory cell arrangement 201 and an assist circuit 702 for example corresponding to assist circuit 203.

The assist circuit 702 includes a pFET 703 whose source is connected to the high supply potential and whose drain is connected to the drain of a first nFET 704 whose source is connected to a low supply potential. The drain of the first nFET 704 is further connected to a word line 705 of the memory array 701. The gates of the pFET 703 and of the first nFET 704 receive an input signal WLB for activating and deactivating the word line 705.

The assist circuit 702 further includes a first inverter 706 whose supply nodes are connected to the word line 705 and ground, whose input receives the signal WLUD<1> and whose output is connected to the gate of a second nFET 707 whose source is connected to ground and whose drain is connected to the word line 705.

The assist circuit 702 further includes a second inverter 708 whose supply nodes are connected to the word line 705 and ground, whose input receives the signal WLUD<0> and whose output is connected to the gate of a third nFET 709 whose source is connected to ground and whose drain is connected to the word line 705.

Thus, the signals WLUD<0:1> control the voltage level on word line 705 via the second nFET transistor 707 and the third nFET transistor 709. This can be used for a word line under drive that is stronger at higher temperatures and weaker at lower temperatures as illustrated in FIG. 8.

Figure 8:
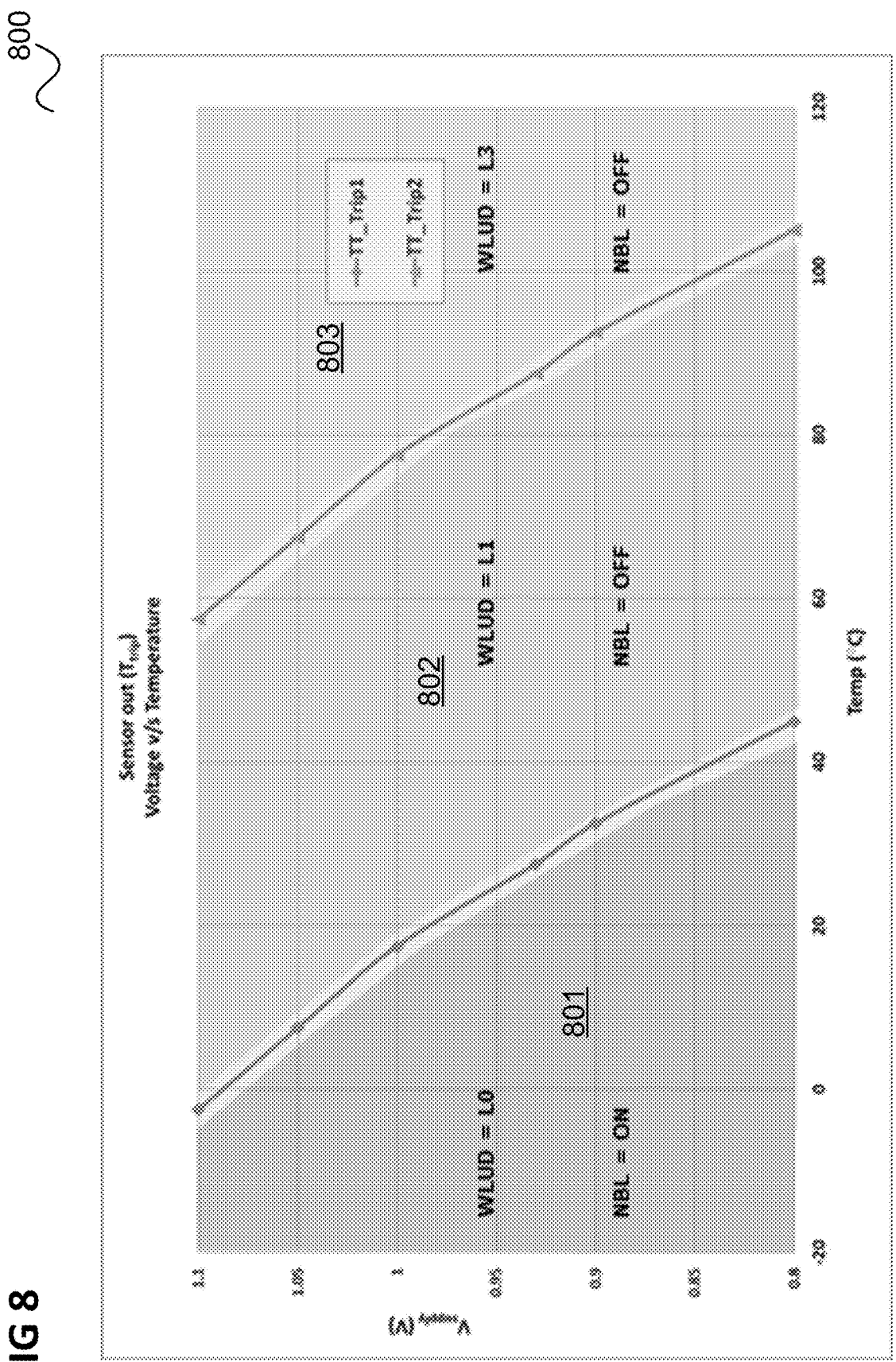
FIG. 8 shows a voltage-temperature diagram.

FIG. 8 shows a voltage-temperature diagram 800.

In this example, it is assumed that, similarly to the example of FIG. 5, a writability circuit (NBL) is controlled in addition to a stability assist circuit, e.g. based on an inverted version of one of WLUD<0> and WLUD<1>.

Since the stability assist circuit is controlled in two steps in this example, there are three control regions 801, 802, 803.

At very low temperatures, in the first control region 801, NBL (i.e. the writability assist circuit) is activated and WLUD (i.e. the stability assist circuit) is deactivated. At intermediate temperatures, in the second control region 802, NBL is deactivated and WLUD is activated at an intermediate level (e.g. WLUD<1> is active while WLUD<0> is not yet active). At high temperatures, NBL is still deactivated and WLUD is activated with its strongest level (both WLUD <1> and WLUD <0> are active) to ensure stable memory device operation.

Figure 9:
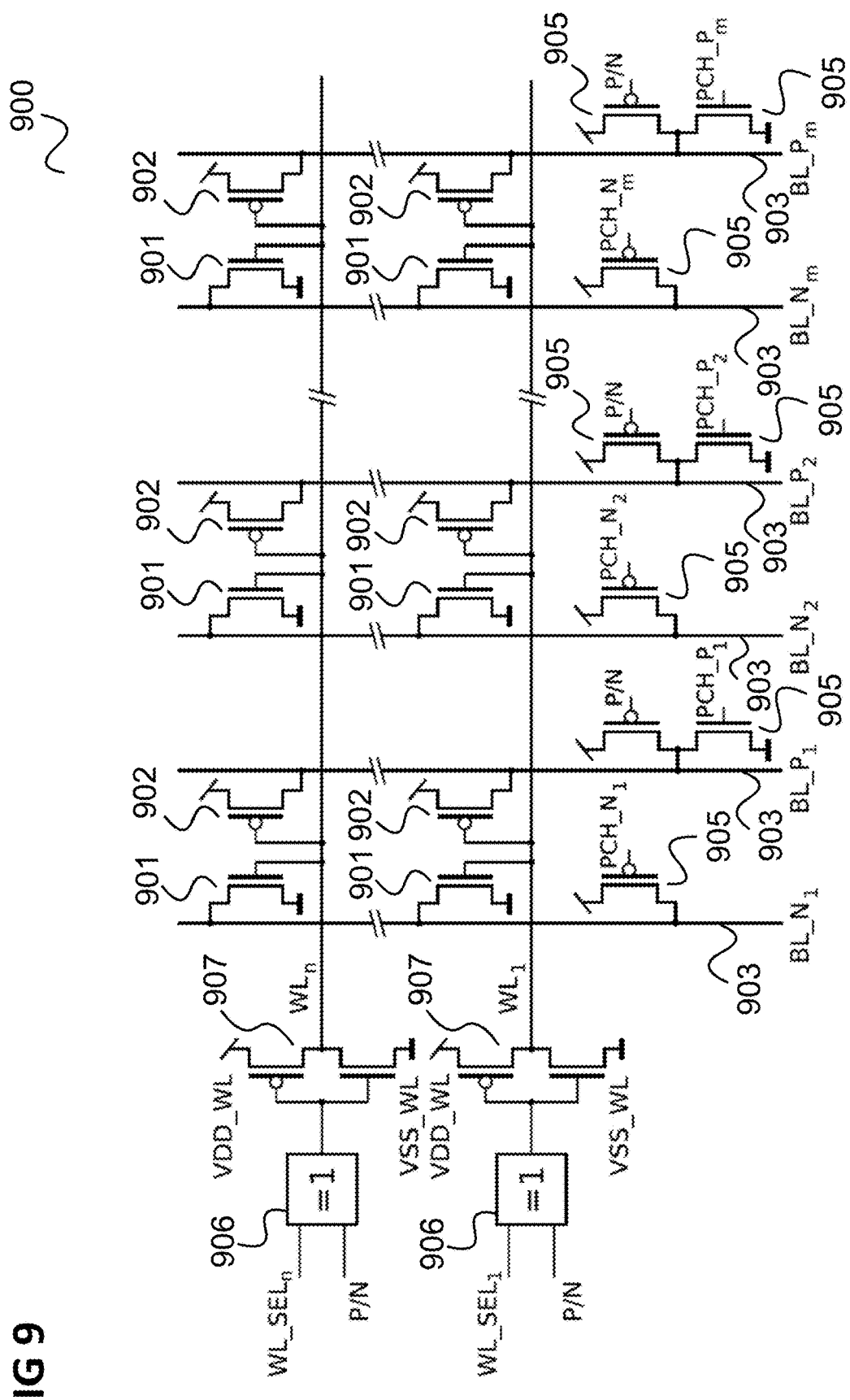
FIG. 9 shows a circuit for generating a control parameter representing aging.

FIG. 9 shows a circuit 900 for generating a control parameter representing aging.

The circuit 900 may for example be used as control parameter source 207 for generating a control parameter depending on aging of the memory device 200.

The circuit 900 includes nFETs 901 whose sources are connected to a low supply potential (VSS_WL), whose drains are connected to bit lines 903 and whose gates are connected to word lines 904.

The circuit 900 further includes pFETs 902 whose drains are connected to the low supply potential (VSS_WL), whose sources are connected to the bit lines 903 and whose gates are connected to the word lines 904.

Further, a plurality of n channel and p channel precharge FETs 905 are connected with their drains to the bit lines 903 whose gates are controlled by precharge control signals.

The bit-lines 903 are for example accessible via a multiplexer that is controlled by a bit-line shift register. This register may also control the pre-charge transistors 905 in such a way that there is no voltage difference across the multiplexers at the unselected bit-lines to avoid leakage current during measurements.

At the word-line side, a shift register generates word line select signals WL_SEL$_i$ (i=1, ..., n). Each word line select signal is fed together with a global signal P/N to a respective XOR gate 906, whose output is connected to a respective inverter 907 whose output is connected to a respective word line.

Thus, the XOR gate 906 sets the word-line of a selected row to either HIGH for measurements on the n-type transistors 901 or to LOW for measurement of the p-type transistors 902.

The impact of aging on the pFETs 902 and NFETs 901 can be monitored on the bit lines 903. The signals of the bit lines 903 may thus be used as input for an assist control circuit, e.g. controller 206.

In the following, an adaptive assist control circuit according to another embodiment is described. Assist control circuits according to various embodiments, such as the one described in the following, allow seamlessly adapting the memory robustness and performance parameters depending upon CMOS (complementary metal oxide semiconductor) manufacturing process variations and real time operating parameters such as junction temperature of the semiconductor material, supply voltage including its fluctuations and device degradation due to the aging process.

Figure 10:
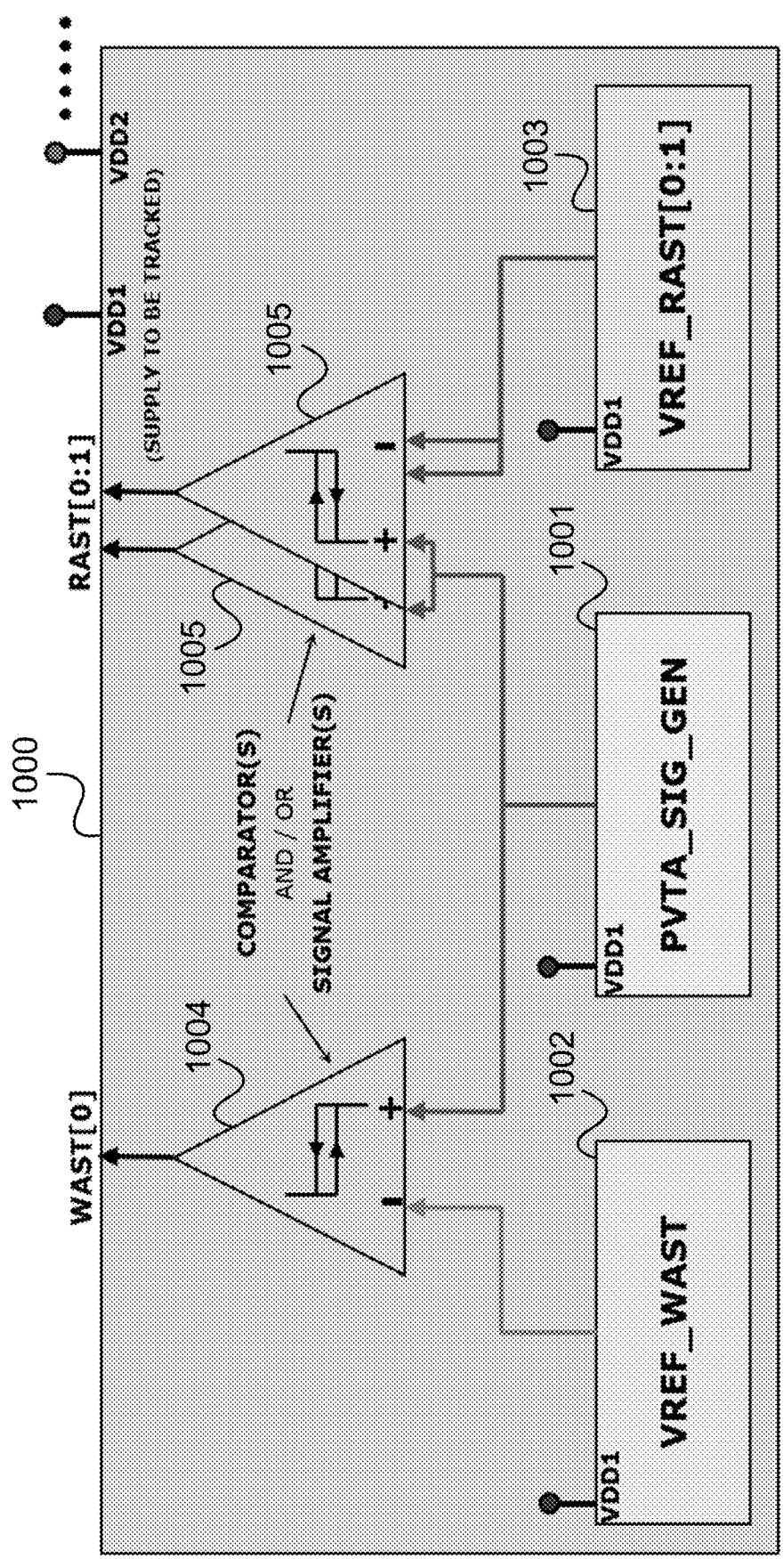
FIG. 10 shows an adaptive assist control circuit according to an embodiment.

FIG. 10 shows an adaptive assist control circuit 1000 according to an embodiment.

The circuit 1000 includes a PVTA signal generator 1001, a first reference signal generator 1002 and a second reference signal generator 1003. Further, the circuit 1000 includes a first comparator whose negative input 1004 is connected to the output of the first reference signal generator 1002 and whose positive input is connected to the output of the PVTA signal generator 1001 and two second comparators 1005 whose positive inputs are connected to the output of the PVTA signal generator 1001 and whose negative inputs are connected to the output of the second reference signal generator 1005. The comparators 1004, 1005 have a temperature and/or voltage hysteresis.

The PVTA signal generator 1001 generates a voltage signal having unified information of the operating conditions which is principally the junction temperature, supply voltage level, process corner and device degradation primarily due to the aging process. This information in form of a signal PVTA_SIG_GEN is compared with reference signals VREF_WAST and VREF_RAST generated by the reference signal generators 1002, 1003, respectively, by the comparators 1004, 1005 to decouple or amplify the effect of process variations and operating conditions.

The reference signal generators 1002, 1003 generate the reference signal(s) which primarily track the relative strength (i.e. P/N skew) of PFET(NFET) vs. NFET(PFET) transistors and the changes in the P/N skew depending upon operating conditions such as junction temperature, supply voltage and device degradation due to the aging process.

Specifically the supply voltage used for the PVTA signal generator 1001 and the reference signal generators 1002, 1003 could be the supply voltage which is intended to be tracked such as the supply voltage being supplied to a memory core cell array.

The comparators 1004, 1005 (and/or signal amplifier elements) provide outputs signals WAST and RAST, respectively. The amplified signals WAST and RAST are used for write and read stability assist, respectively, e.g. to activate a write assist or read assist, respectively, e.g. in a step-wise fashion (as described with reference to FIG. 7).

Figure 11:
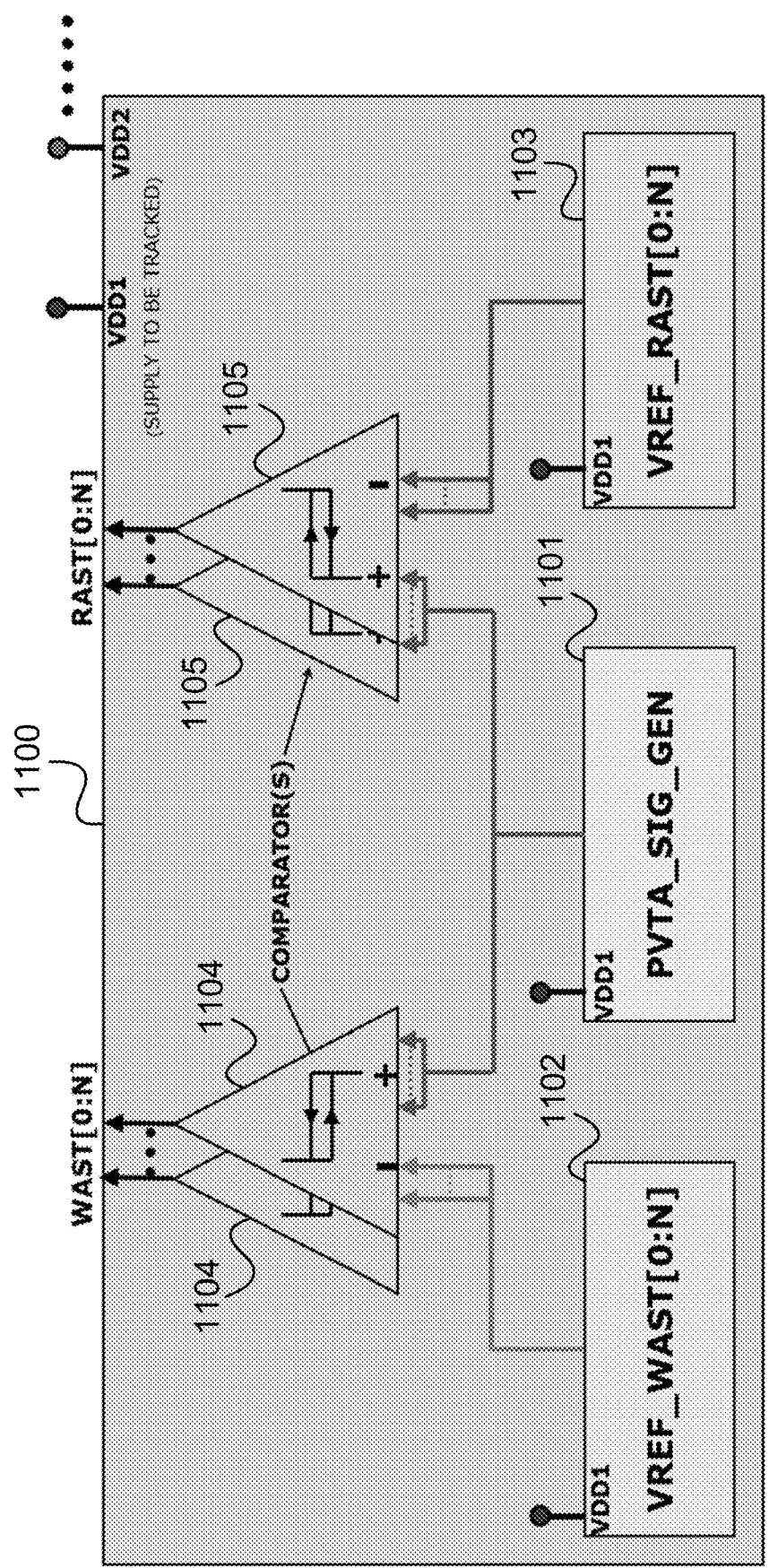
FIG. 11 shows an example of an adaptive assist control circuit allowing a fine granular tuning of the memory performance parameters.

FIG. 11 shows an example of an adaptive assist control circuit 1100 similar to the adaptive assist control circuit 1000 of FIG. 10 where for a fine granular tuning of the memory performance parameters, comparators 1004, 1005 are replicated, i.e. a plurality of first comparators 1104 and a plurality of second comparators 1105 are provided, resulting into generation of more control signals such as WAST[0:N] for write assist and RAST[0:N] for read assist respectively, where N>=1.

Figure 12:
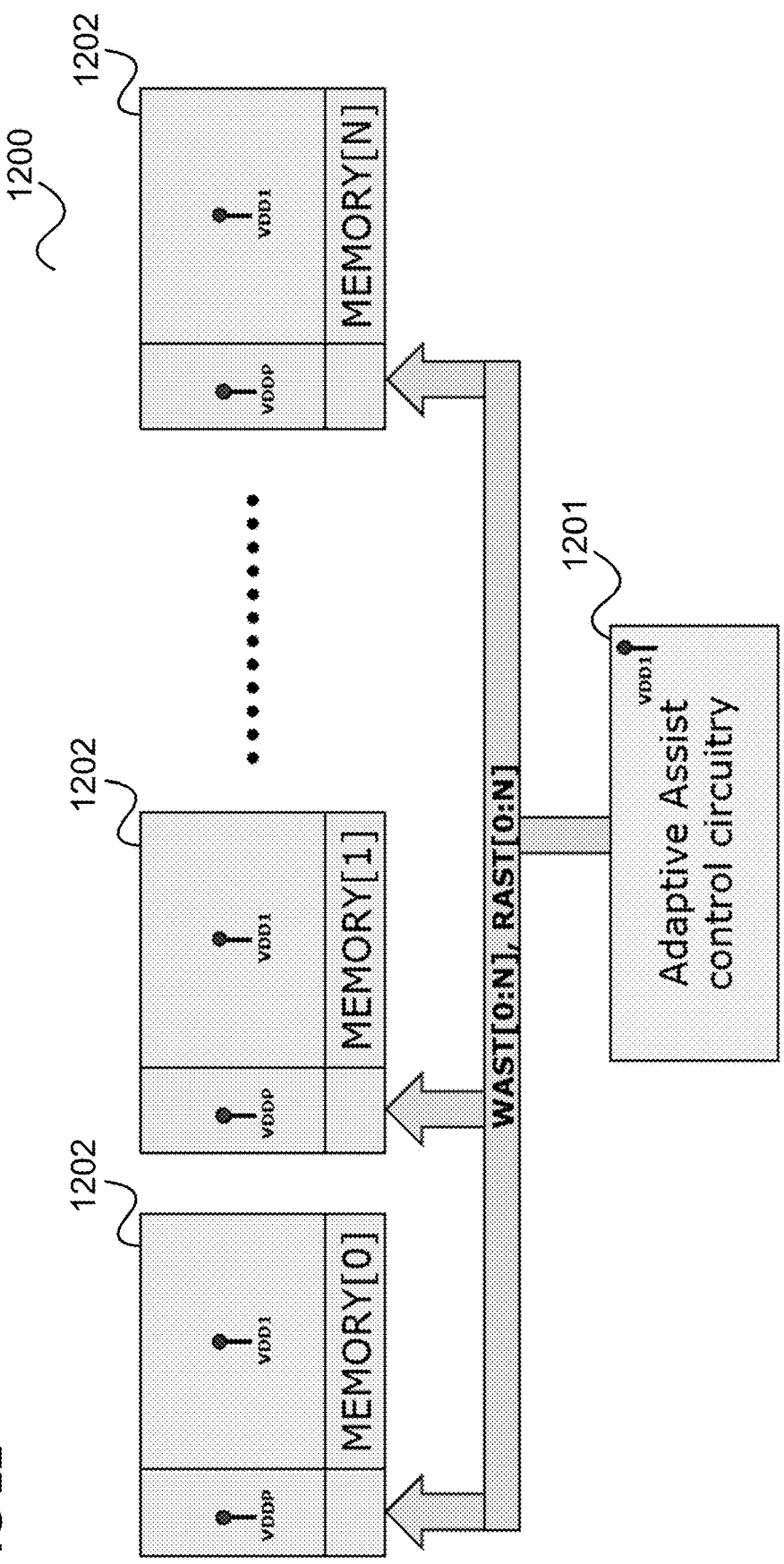
FIG. 12 shows a memory arrangement including a common adaptive assist control circuitry for a plurality of memories.

FIG. 12 shows a memory arrangement 1200 including a common adaptive assist control circuitry 1201 (e.g. as shown in FIG. 11) for a plurality of memories 1202 which generates assist control signals (WAST, RAST) for all the memories 1202 in a sub-system or a power domain. This allows a smaller area utilization for adaptive assist control circuitry and reduced power consumption (compared to having an assist control circuit for each memory 1202).

Figure 13:
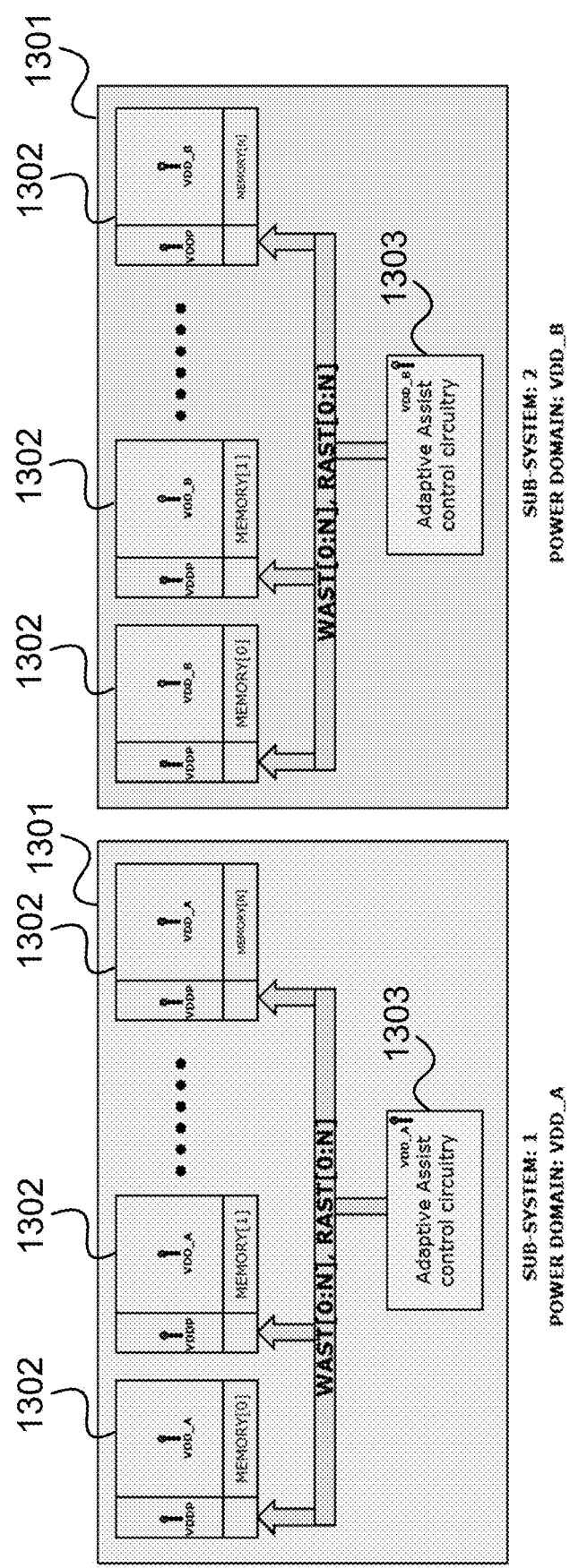
FIG. 13 shows a memory arrangement including a plurality of sub-systems of different power domains wherein each sub-system includes a respective plurality of memories which are provided with assist control signals by a respective common assist circuit.

FIG. 13 shows a memory arrangement 1300 including a plurality of sub-systems 1301 of different power domains wherein each sub-system 1301 includes a respective plurality of memories 1302 which are provided with assist control signals by a respective common assist circuit 1303.

Figure 14:
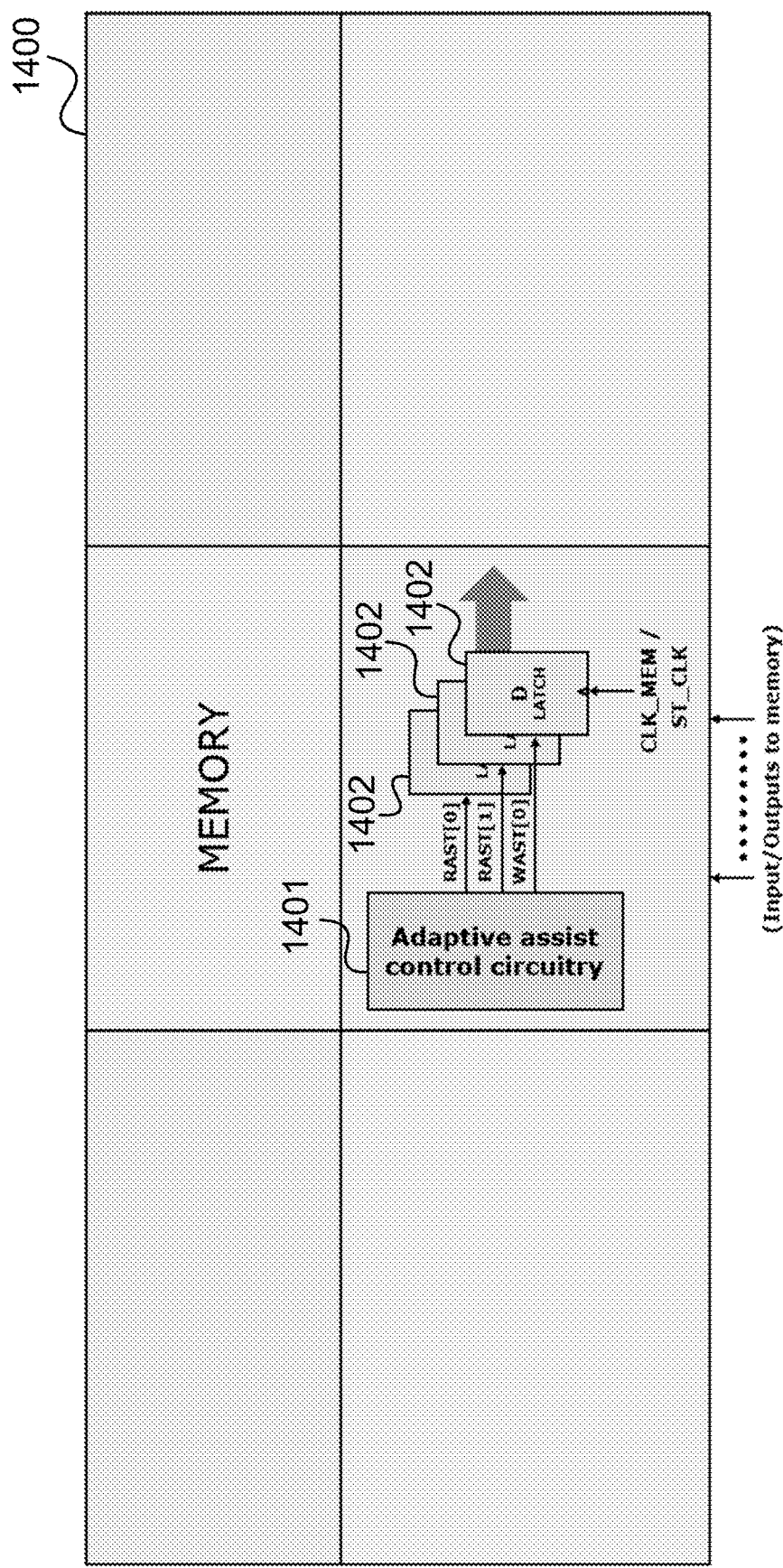
FIG. 14 shows a memory with an embedded adaptive assist control circuit.

FIG. 14 shows a memory 1400 with an embedded adaptive assist control circuit 1401.

In this example, the assist control circuit 1401 controls assist functions via D-latches 1402.

This allows (compared to a memory-external implementation of the assist control circuit) a closer tracking of CMOS process and better assist tuning adaptation for the memory 1400: Due to on-chip process gradients the CMOS device performance can vary from device to device depending upon their physical distance between the devices. Similarly two different memories on the same chip can have different performances due to differences in the underlying process.

Further, this allows a better tracking of the localized operating conditions: Difference in activity factors of the different circuit blocks can result in on-chip temperature gradients and differences in the supply voltages levels primarily due to differential IR-drop. Thus an embedded adaptive assist control circuitry provides even precise tracking of the localized temperature and supply voltage levels.

Additionally, an embedded implementation provides a faster or instantaneous feedback to the memory 1400 about the operating conditions in comparison to the common implementation for a sub-system (e.g. as in FIGS. 12 and 13) where some additional delay of few clock cycles can be expected.

Figure 15:
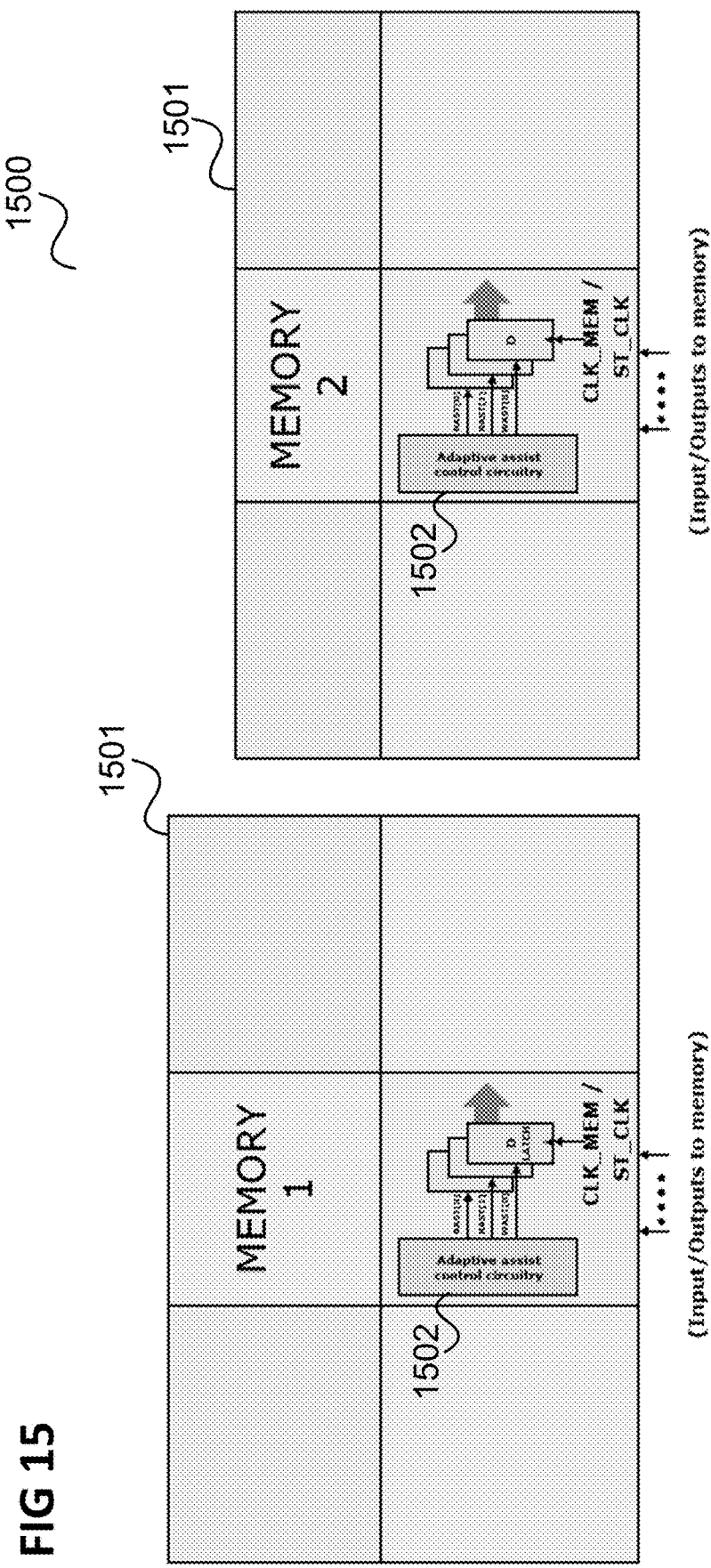
FIG. 15 shows a memory arrangement including a plurality of memories, which are each integrated with a similar adaptive assist control circuit.

FIG. 15 shows a memory arrangement 1500 including a plurality of memories 1501, e.g. different types of memories, which are each integrated with a similar adaptive assist control circuit 1502, wherein the adaptive assist control circuit possibly have different settings for the reference signal generators and the PVTA signal generator. This enables the usage of different memory cells such as High-Density, High-Performance, Dual-Port etc. having different behavior towards process corners and operating conditions and thus different assist setting requirements.

Figure 16:
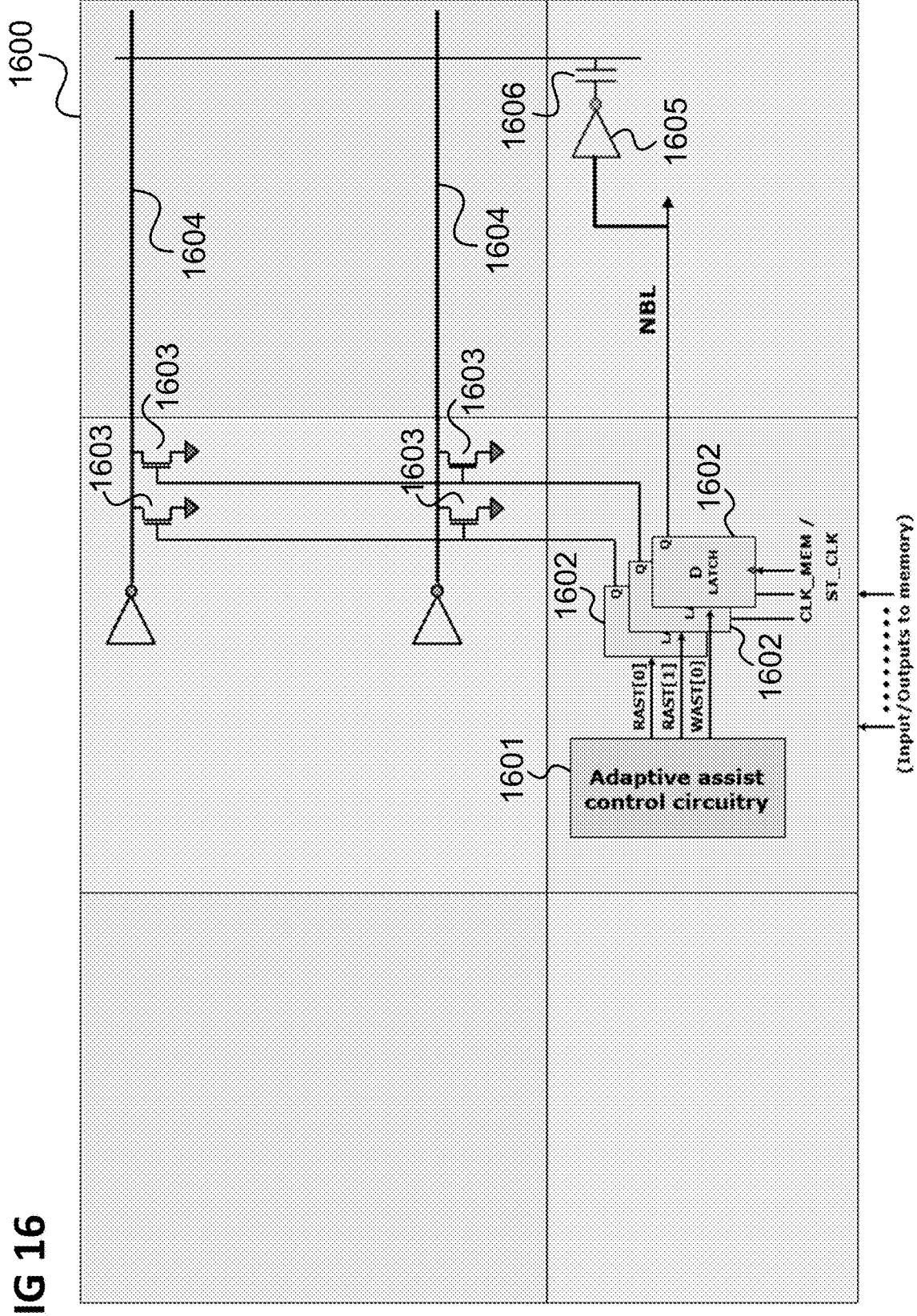
FIG. 16 shows a memory with an embedded assist control circuit in more detail.

FIG. 16 shows a memory 1600 with an embedded assist control circuit 1601 in more detail.

The assist control circuit 1601 controls assist functions via D-latches 1602. Specifically, read assist bit signals RAST[0] and RAST[1] are provided via respective ones of the D-latches 1602 to the gates of transistors 1603 for reducing the word line 1604 voltage similarly to the implementation of FIG. 7 and the write assist bit signal WAST[0] is provided via one of the D-latches 1602 and an inverter 1605 to a capacitor 1606 connected to a bit line 1607.

Figure 17:
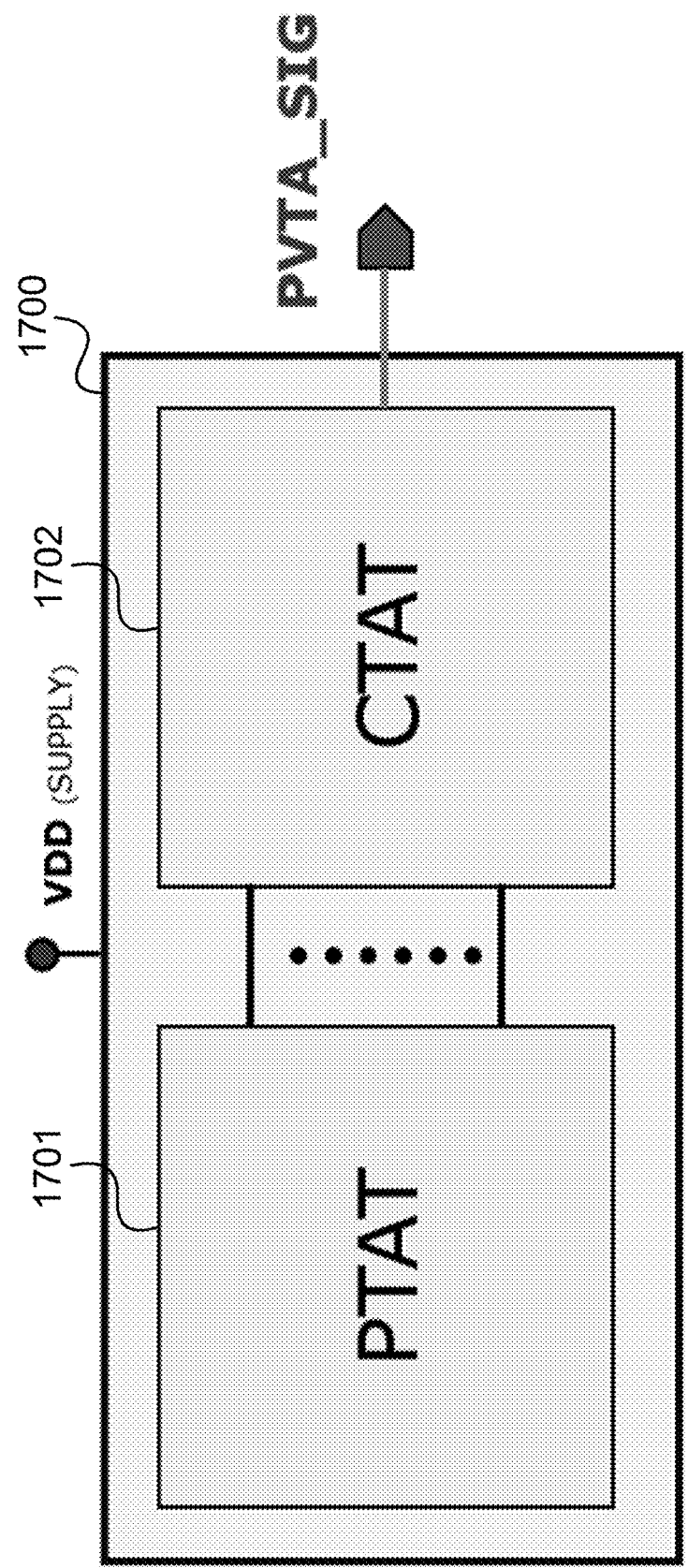
FIG. 17 shows an example of a signal generator.

FIG. 17 shows an example of a PVTA signal generator 1700.

The PVTA signal generator 1700 includes a cascaded PTAT (CTAT)⇔CTAT (PTAT) structure with a PTAT (proportional to absolute temperature) circuit 1701 and a CTAT (complementary to absolute temperature) circuit 1702 to generate the PVTA_SIG signal which primarily tracks:
  The localized junction temperature of the silicon.
  The voltage supplied to the respective circuitry.
  Additionally the circuit 1700 is designed to provide strong influence with:
  Varied CMOS process corner lots (Fast, Nominal, Slow).
  Relative strengths of NFET (PFET) to PFET (NFET) e.g:
    SF & FS (Slow-N/Fast-P and Fast-N/Slow-P respectively).

Further, aging degradation primarily tracking the PFET degradation due to the NBTI (negative bias temperature instability) effect may be considered.

Figure 18:
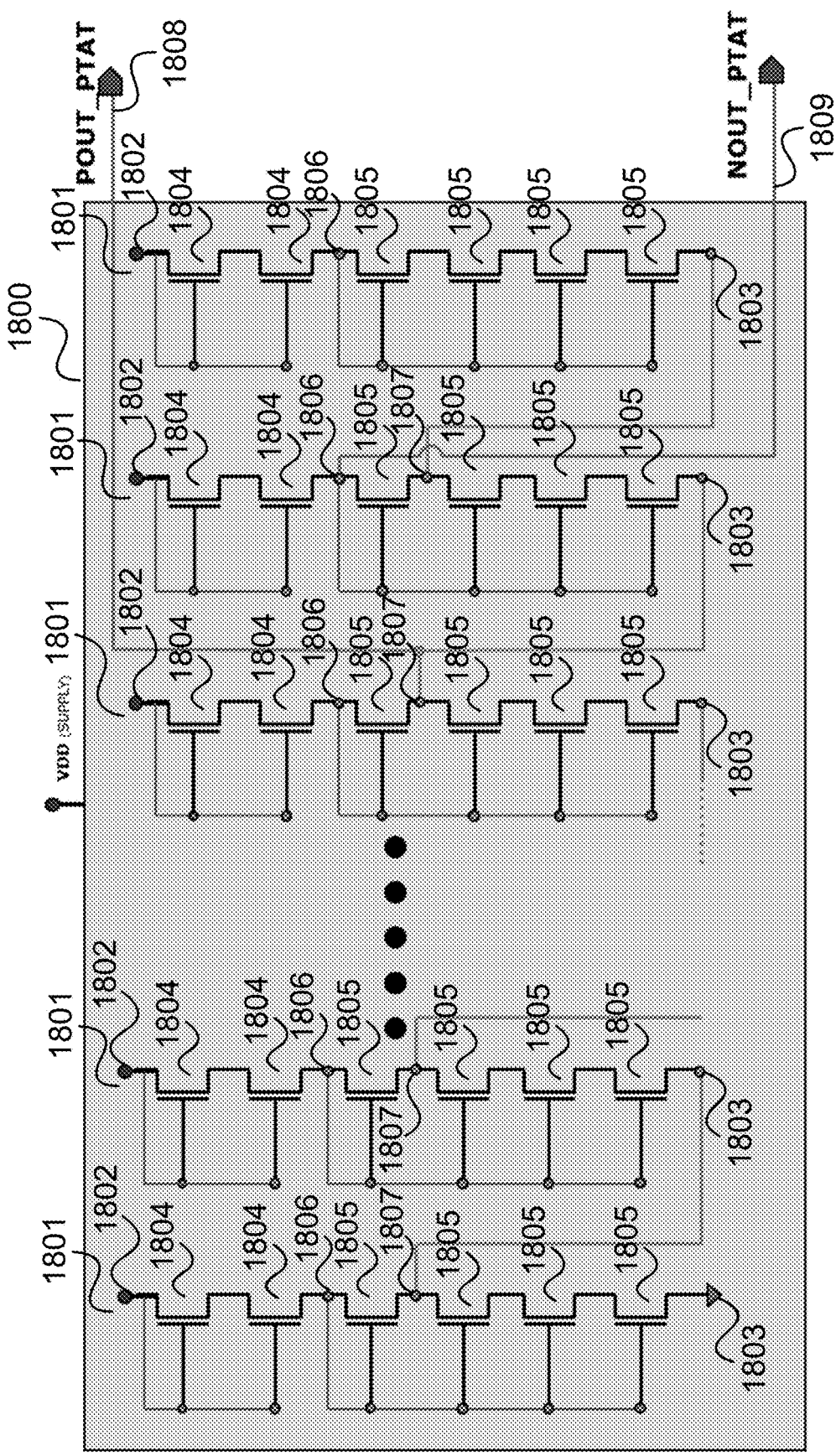
FIG. 18 shows an example of a PTAT (proportional to absolute temperature) circuit.

FIG. 18 shows an example of a PTAT circuit 1800.

The PTAT circuit 1800 includes a plurality of serial connections 1801 of FETs 1804, 1805, wherein each serial connection 1801 is connected between a high supply potential 1802 and an input node 1803 and the gates of upper (i.e. nearer to the high supply potential) FETs 1804 are connected to the high supply potential and the gates of lower (i.e. farther from the high supply potential) FETs are connected to the node 1806 connecting the upper FETs 1804 to the lower FETs 1805.

The input node 1803 of the first (leftmost) serial connection 1801 is connected to a low supply potential. The inputs node of each following serial connection 1801 (except for the last) is connected to a middle node 1807 of the preceding serial connection 1801. The middle node 1807 of the third to last serial connections 1801 is connected to a first (positive) output 1808 of the circuit 1800. The middle node of the second to last serial connection 1801 is connected to the input node 1803 of the last serial connection 1801 and the node 1806 of the second to last serial connection 1801 is connected to a second (negative) output 1809.

Figure 19:
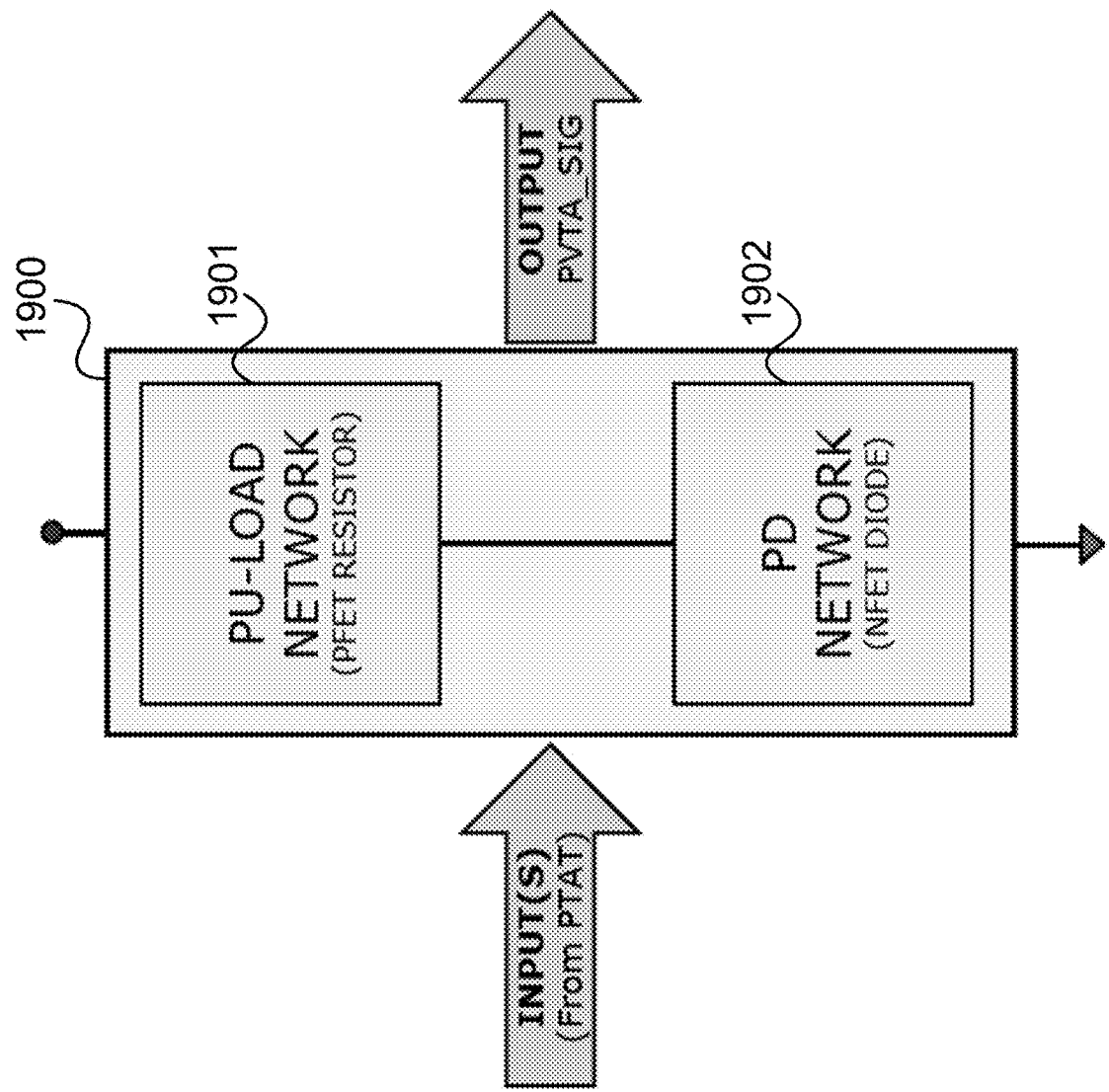
FIG. 19 shows an example of a CTAT (complementary to absolute temperature) circuit.

FIG. 19 shows an example of a CTAT circuit 1900.

The CTAT circuit 1900 includes a pull-up load network 1901, e.g. consisting of PFET transistors used as resistors, and a pull-down network 1902, e.g. consisting of NFET diodes. The CTAT circuit 1900 receives the outputs of the PTAT circuit 1701 (e.g. PTAT circuit 1800) as inputs and outputs the PVTA signal generator output signal PVTA_SIG.

Figure 20:
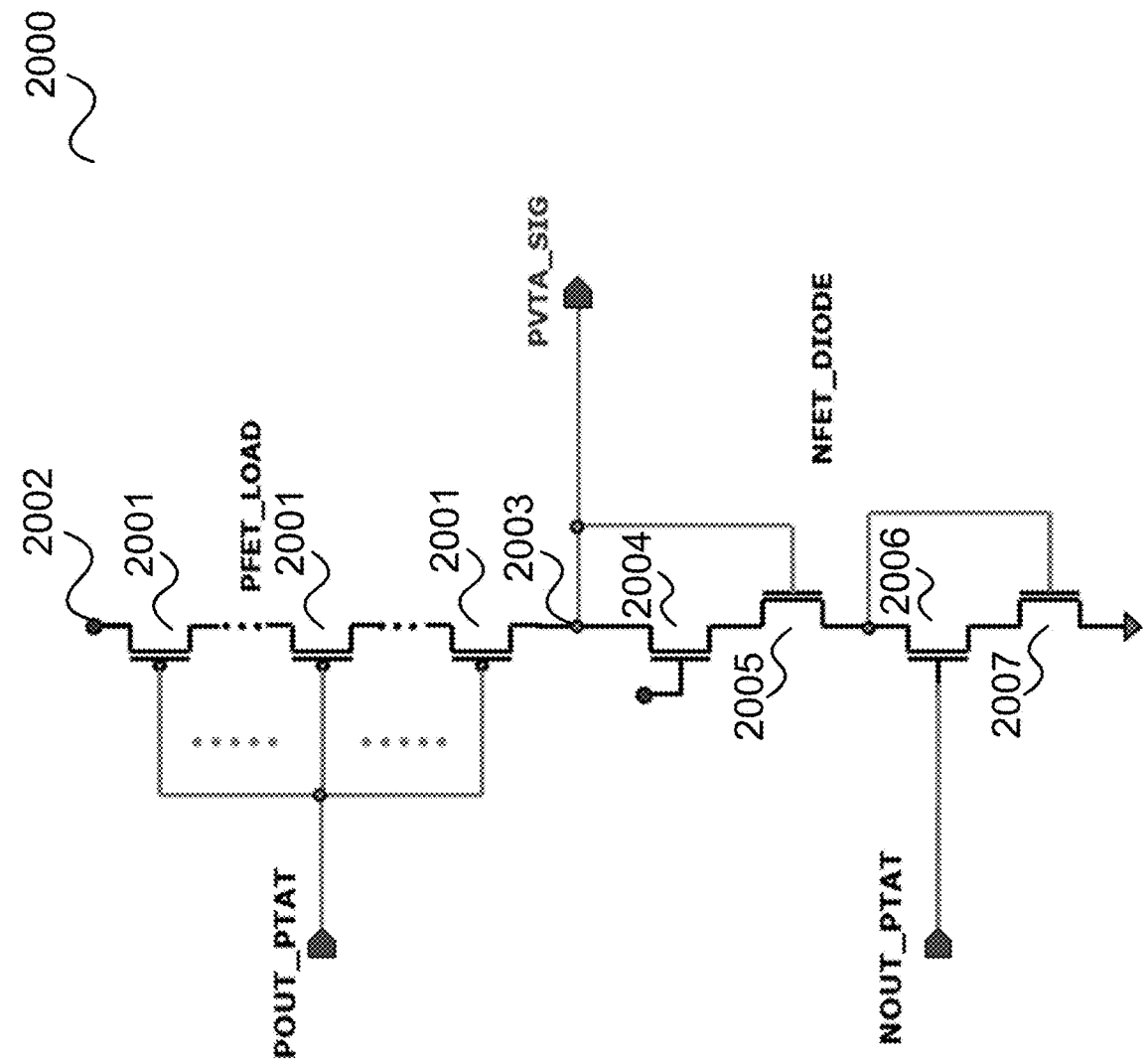
FIG. 20 shows a possible implementation of a CTAT circuit by a PFET (p channel field effect transistor) resistor network and an NFET (n channel field effect transistor) diode network.

FIG. 20 shows a possible implementation of a CTAT circuit 2000 by a PFET resistor network and a NFET diode network.

The CTAT circuit 2000 includes three serially connected PFETs 2001 whose gates are connected to the positive output of the PTAT circuit. The serial connection of PFETs 2001 is connected between a high supply potential 2002 and an output node 2003 of the CTAT circuit 2000. The output node 2003 is connected to the drain of a first NFET 2004 whose gate is connected to the high supply potential and whose source is connected to the drain of a second NFET 2005 whose gate is connected to the output node 2003 and whose source is connected to the drain of a third NFET 2006.

The gate of the third NFET 2006 is connected to the negative output of the PTAT circuit. Its source is connected to the drain of a fourth NFET 2007 whose gate is connected to the drain of the third NFET 2006 and whose source is connected to the low supply potential.

Figure 21:
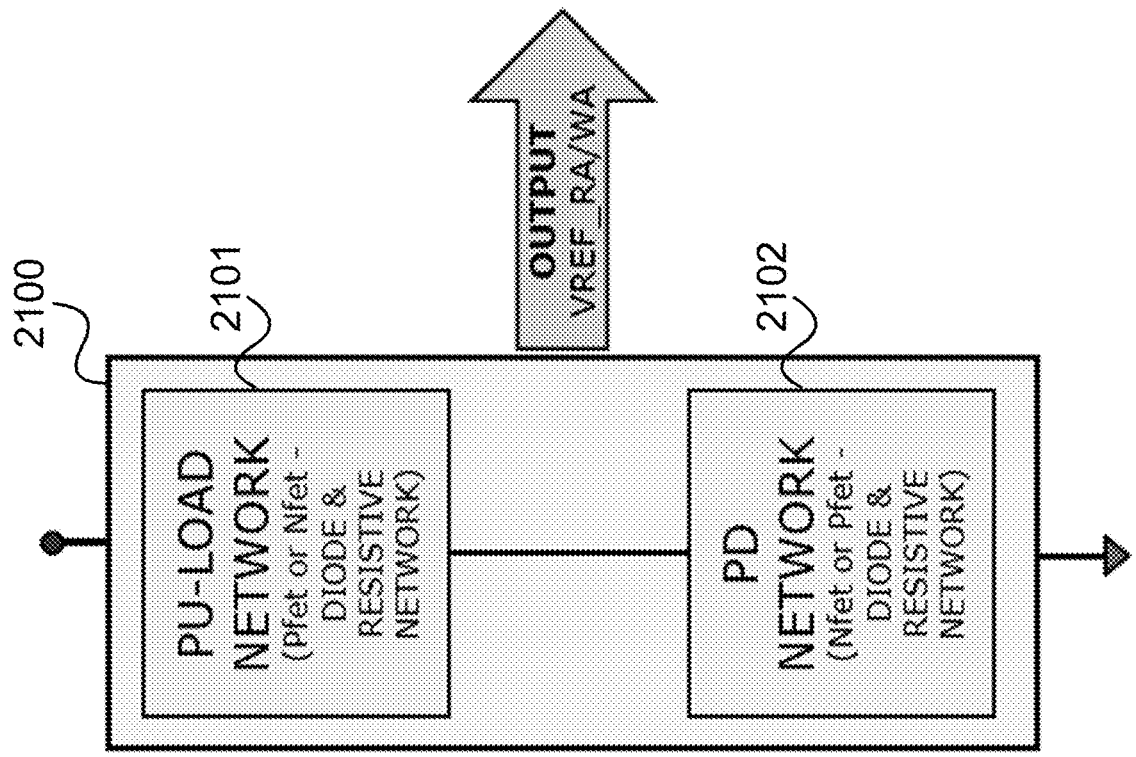
FIG. 21 shows an example of a reference signal generator.

FIG. 21 shows an example of a reference signal generator 2100.

The reference signal generator includes a pull-up load network 2101 for example possibly consisting of PFET transistors used as resistors and diodes and a pull-down network 2102 consisting of NFET diodes and resistors.

Figure 22:
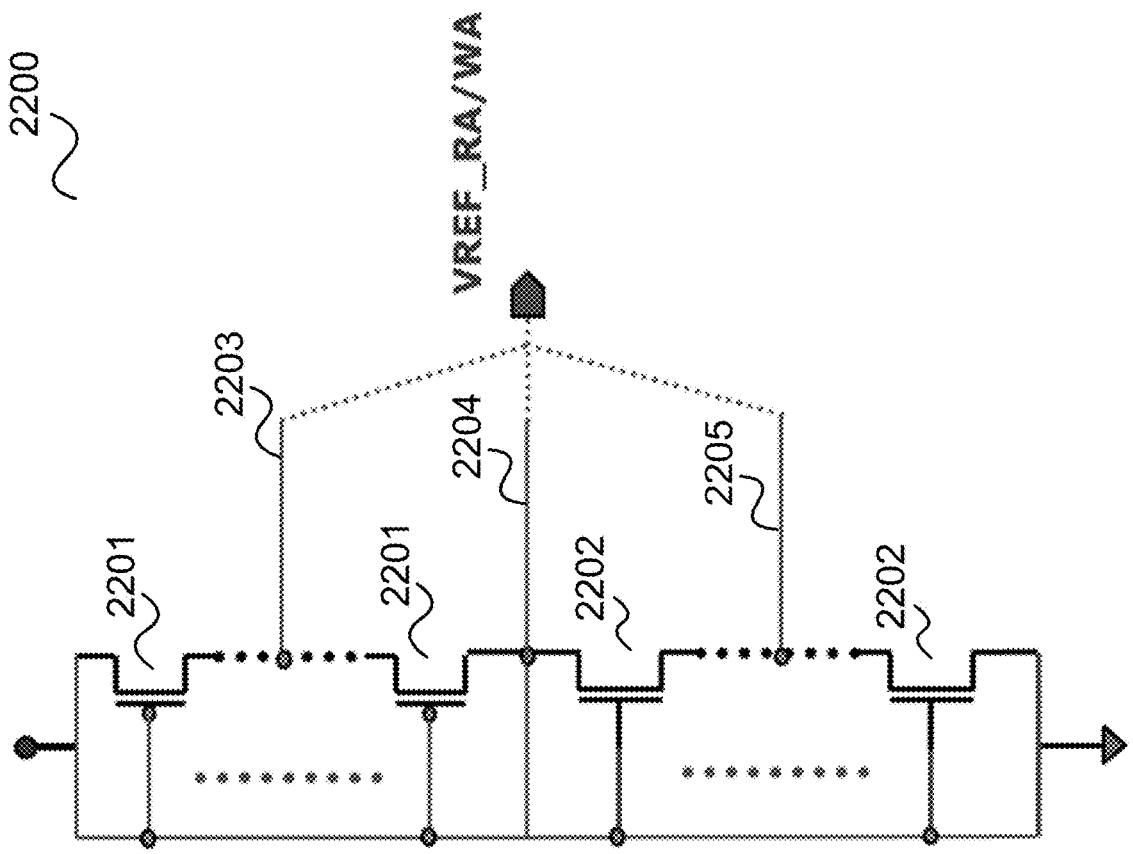
FIG. 22 shows an example for an implementation of a reference signal generator by means of a PFET resistor and diode network and an NFET diode and resistor network.

FIG. 22 shows an example for an implementation of a reference signal generator 2200 by means of a PFET resistor and diode network and an NFET diode and resistor network.

The reference signal generator 2200 comprises a serial connection of PFETs 2201 serially connected between a high supply potential and a serial connection of NFETs 2202 which is itself connected between the serial connection of PFETs 2201 and the low supply potential.

The strength of PMOS network (serial connection of PFETs 2201) versus the NMOS network (serial connection of NFETs 2202) can be adjusted through sizing.

The circuit reference signal generator allows reference signal generation through only the NMOS network, the PMOS network or a combination of both as indicated by alternative output connections 2203, 2204, 2205.

Figure 23:
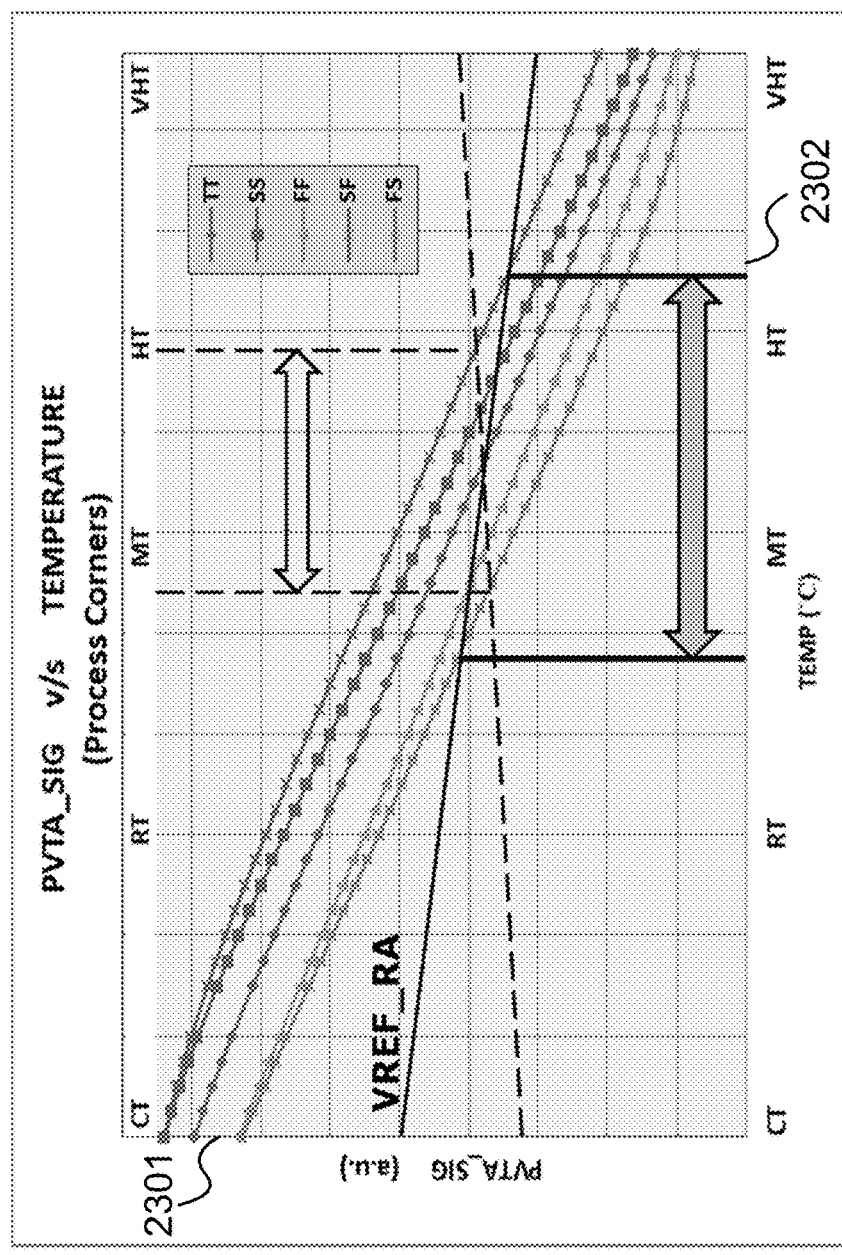
FIG. 23 shows the generated voltage levels of a signal along with varied junction temperature for different CMOS manufacturing process corners.

FIG. 23 shows the generated voltage levels of the PVTA_SIG signal (in accordance with the vertical axis 2301) along with varied junction temperature (indicated along the horizontal axis 2302) for different CMOS manufacturing process corners (TT/SS/FF/SF/FS).

As explained with reference to FIG. 11, the signal PVTA_SIG is compared with the reference signal VREF_RAST and/or VREF_WAST resulting into the generation of the digital output RAST and/or WAST signals which are primarily dependent on only underlying manufacturing process, operating conditions such as junction temperature, supply voltage and is invariant otherwise to factors such as time.

The generated signal RAST and/or WAST is further used to activate and tune/adjust the memory performance parameters such as assist settings.

Additionally, in the above settings, the VREF reference signal has been chosen to amplify the effect of the process variations and is shown on the lower temperature scale.

Figure 24:
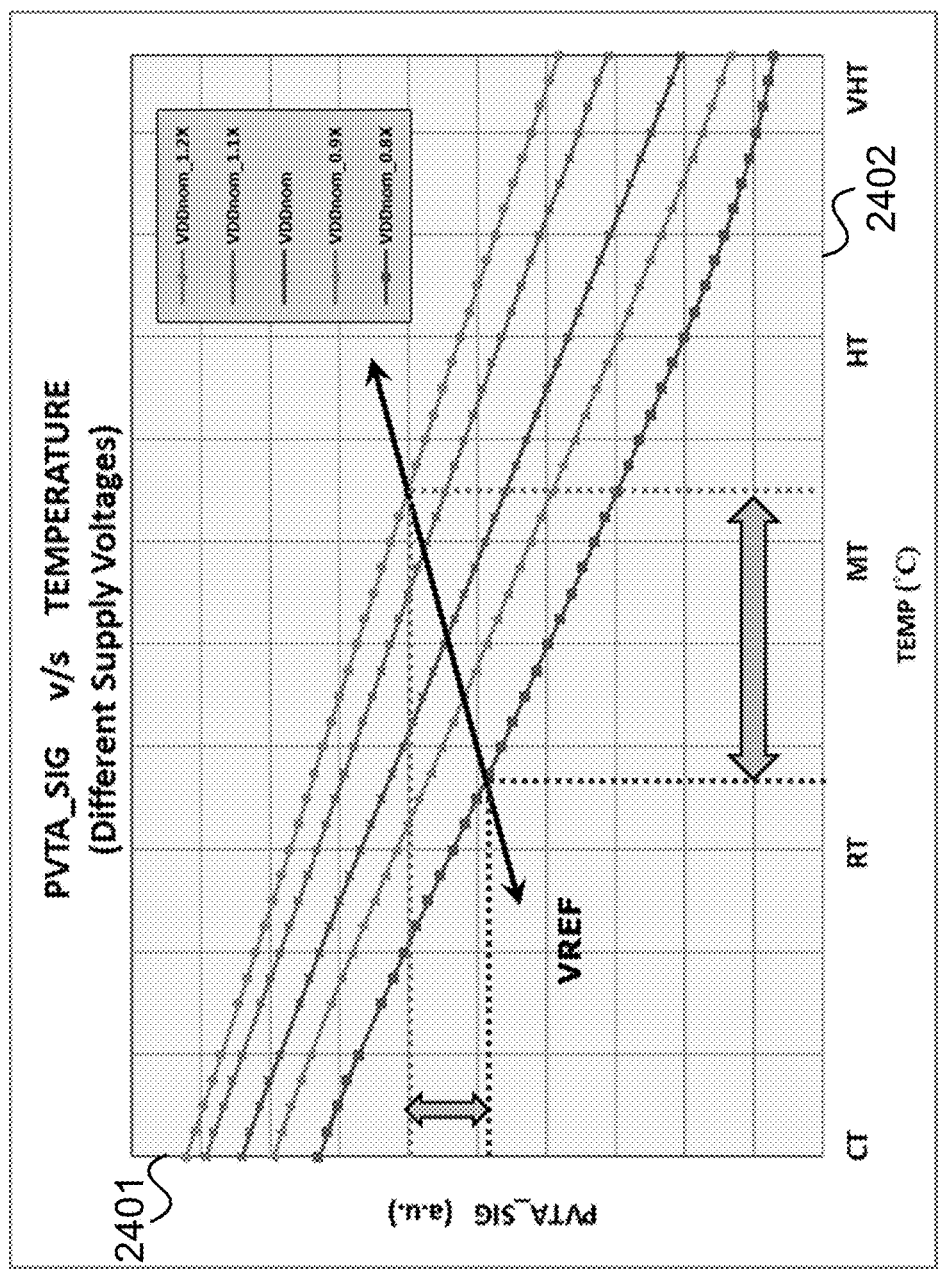
FIG. 24 shows the tracking of a signal depending on junction temperature for different supply voltages.

FIG. 24 shows the tracking of the PVTA_SIG signal (in accordance with the vertical axis 2301) depending on junction temperature (indicated along the horizontal axis 2302) for different supply voltages which is further compared with reference signals VREF_WAST and VREF_RAST to generate the WAST and RAST signals, respectively.

Figure 25:
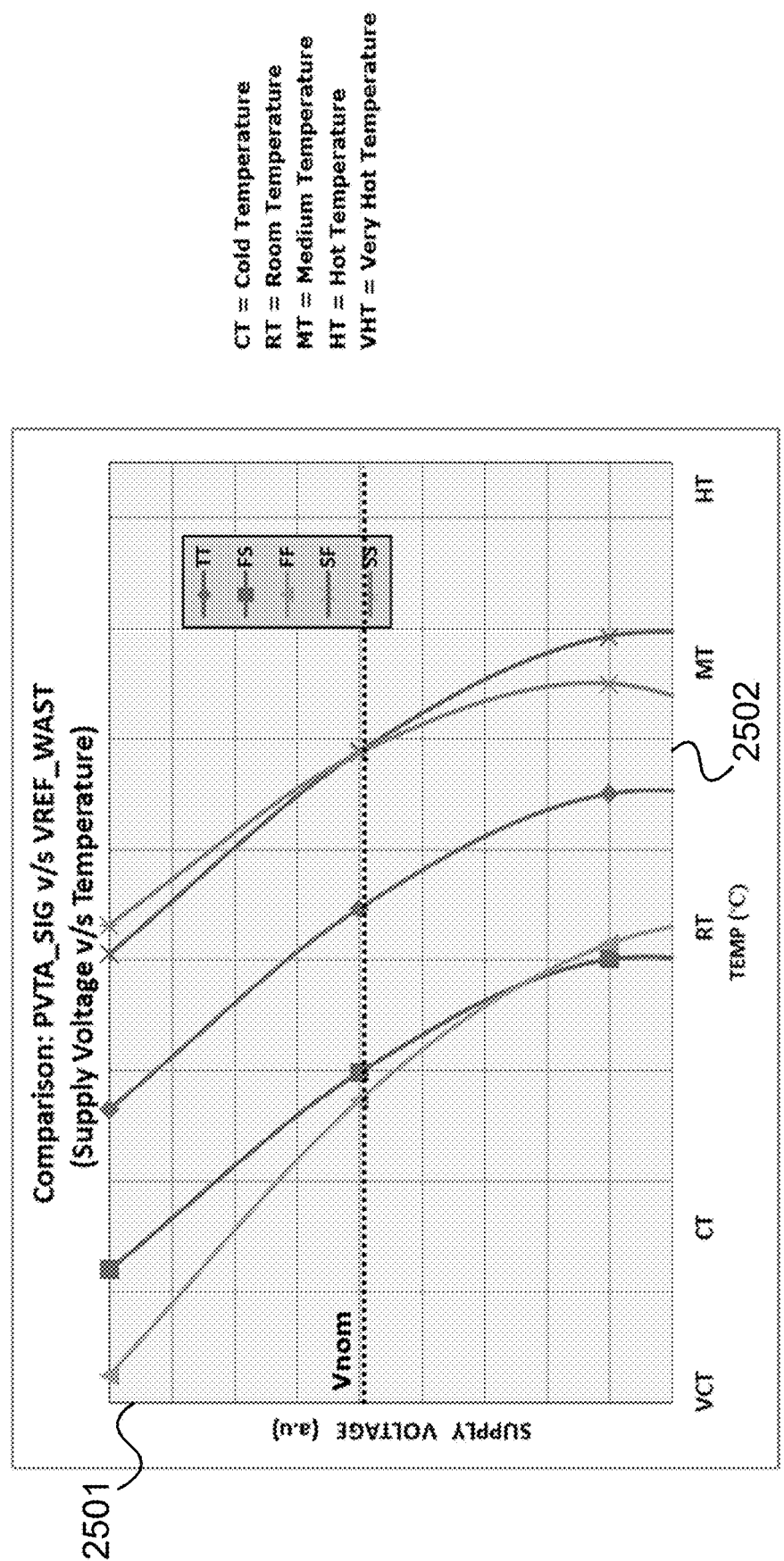
FIG. 25 gives examples for the behavior of the comparison of two signals.

FIG. 25 gives examples for the behavior of the comparison of the PVTA_SIG signal with the VREF_WAST signal depending on supply voltage (in accordance with the vertical axis 2501) and depending on temperature (indicated along the horizontal axis 2502) for different process corners.

It can be inferred that adaptive assist control circuit operational at a nominal voltage Vnom will have the write assist activated when
  $T_j<(CT+RT)/2$ and CMOS process=FF or FS
  $T_j<RT$ and CMOS process=TT
  $T_j<MT$ and CMOS process=SS or SF.

Figure 26:
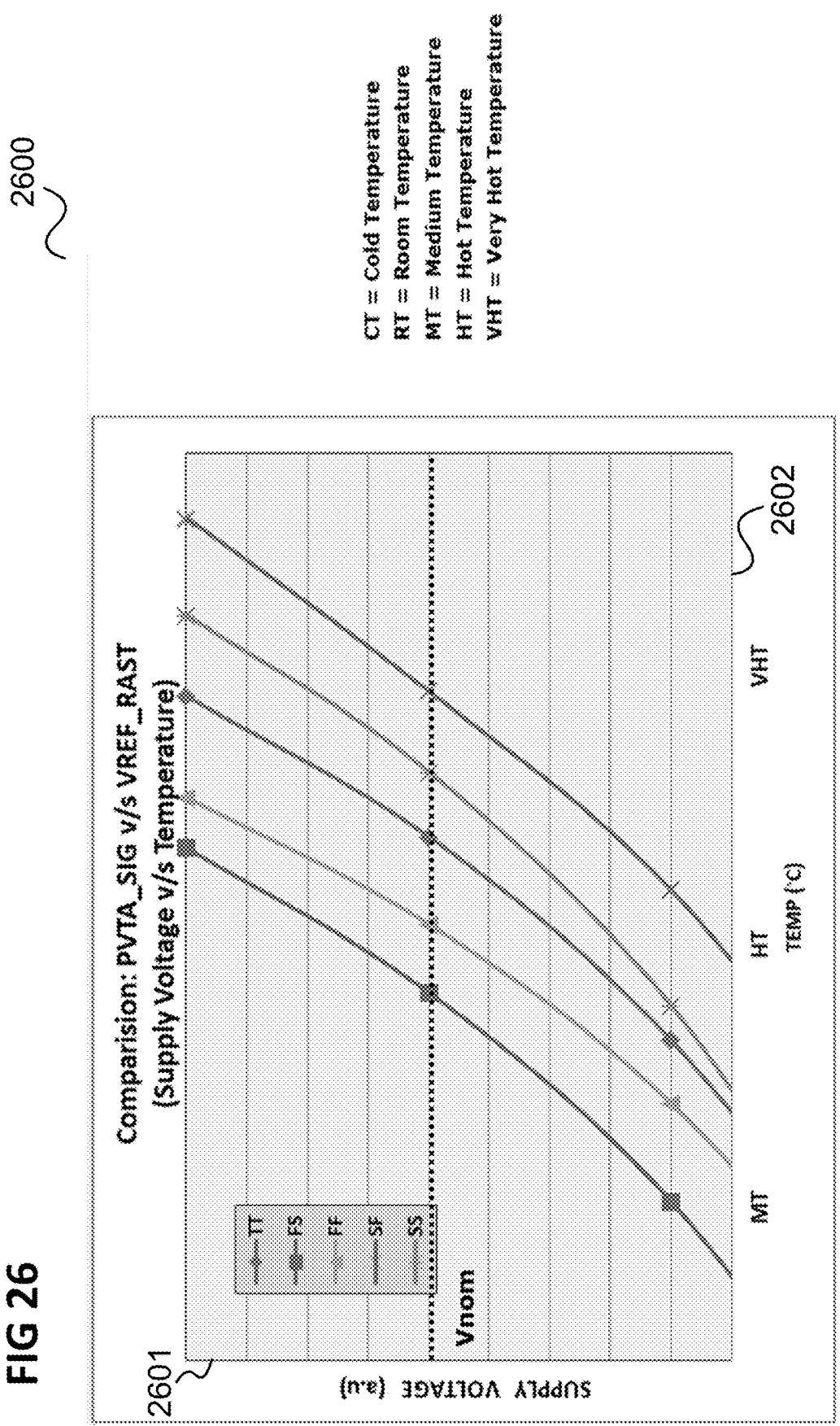
FIG. 26 gives examples for the behavior of the comparison of two signals.

FIG. 26 gives examples for the behavior of the comparison of the PVTA_SIG signal with the VREF_RAST signal depending on supply voltage (in accordance with the vertical axis 2601) and depending on temperature (indicated along the horizontal axis 2602) for different process corners.

It can be inferred that adaptive assist control circuit operational at nominal voltage Vnom will have the read assist activated when
  $T_j>(MT+HT)/2$ and CMOS process=FS
  $T_j>HT-\Delta$ and CMOS process=FF
  $T_j>HT+\Delta$ and CMOS process=TT
  $T_j>(HT+VHT)/2$ and CMOS process=SS
  $T_j>VHT-\Delta$ and CMOS process=SF.

With the definitions AST <0, 1>=RAST[0:1] and AST<2>=WAST[0], the assist control for example follows table 1 leading to a behavior as illustrated in FIG. 5.

TABLE 1

| $T_j$ | AST<0, 1> | AST<2> |
|---|---|---|
| $>T_{trip}$ | 1 | 0 |
| $<T_{trip}$ | 0 | 1 |

As another example, With the definitions AST <0, 1>=RAST[0:1] and AST<2>=WAST[0], the assist control for example follows table 2 leading to a behavior as illustrated in FIG. 7.

TABLE 2

| $T_j$ | AST<0> | AST<1> | AST<2> |
|---|---|---|---|
| $T_j < T_{trip-1}$ | 0 | 0 | 1 |
| $T_{trip-2} > T_j > T_{trip-1}$ | 1 | 0 | 0 |
| $T_j > (T_{trip-1}, T_{trip-2})$ | 1 | 1 | 0 |

Figure 27:
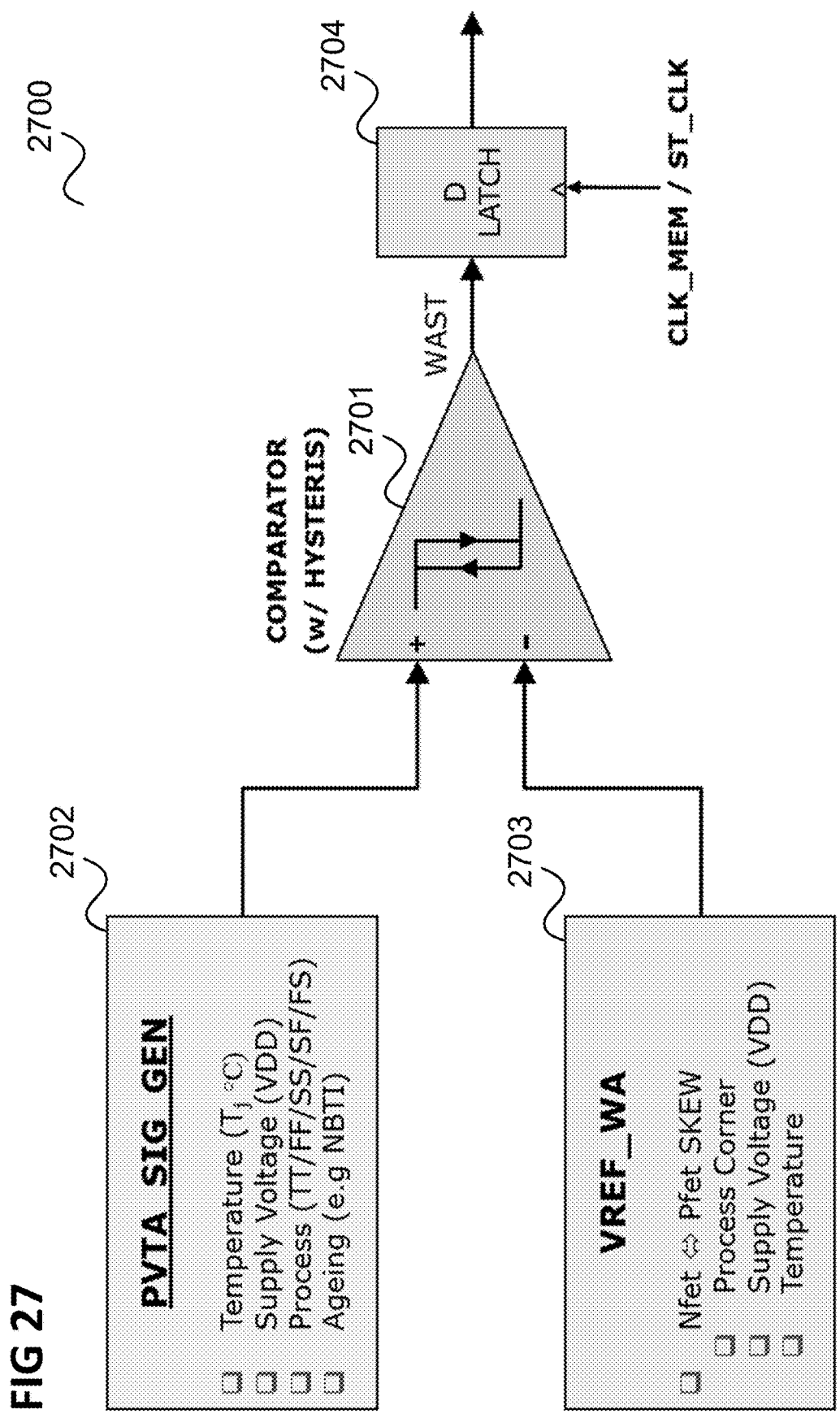
FIG. 27 illustrates the generation of a 1-bit write assist control signal.

FIG. 27 illustrates the generation of a 1-bit write assist control signal.

A comparator 2701 with hysteresis compares a PVTA signal generated by a PVTA signal generator 2702 with a write assist reference signal generated by a reference signal generator 2703. The result of the comparison is a WAST signal supplied to a D-latch 2704 for controlling a write assist circuit.

Figure 28:
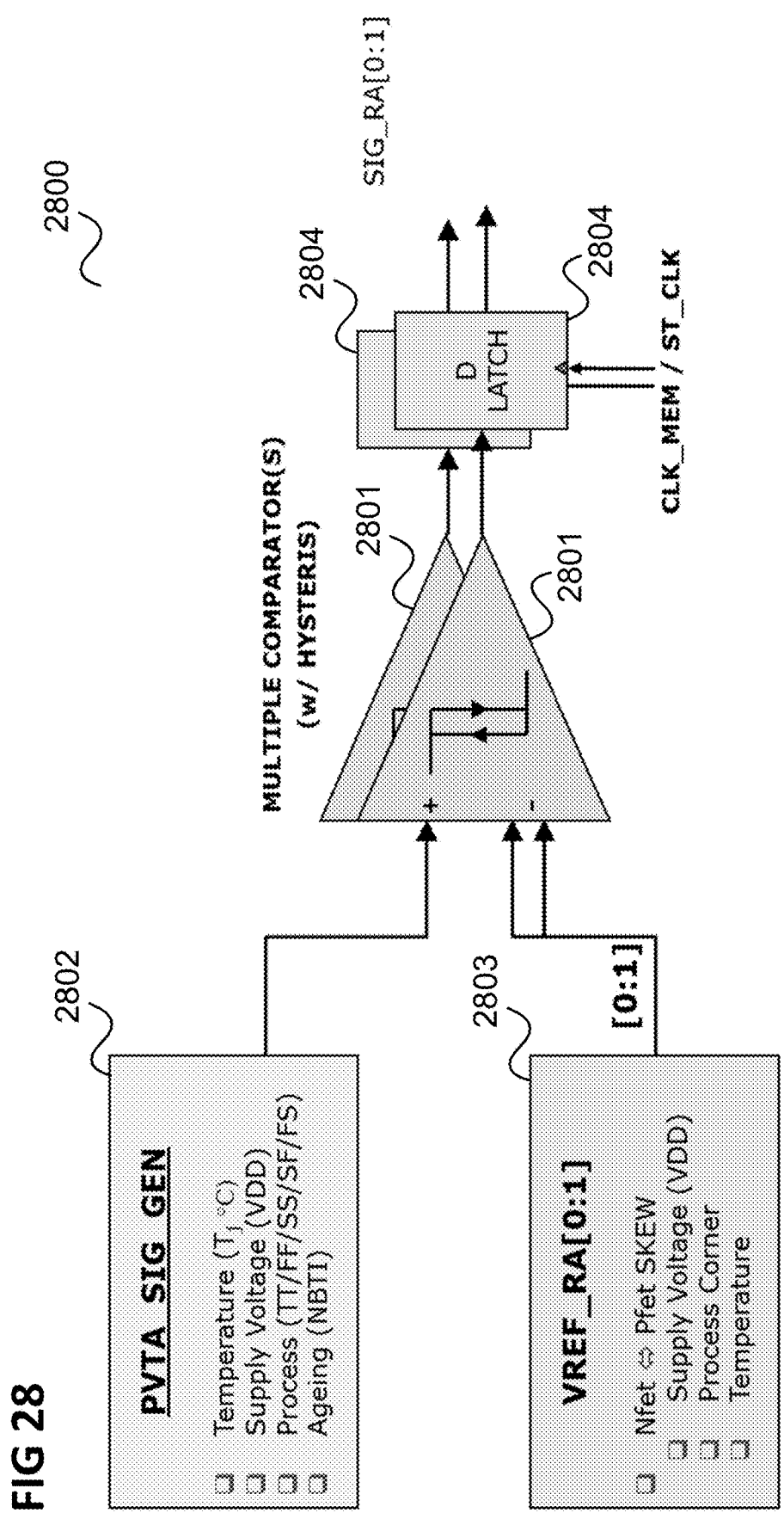
FIG. 28 illustrates the generation of a 2-bit read assist control signal.

FIG. 28 illustrates the generation of a 2-bit read assist control signal.

Two comparators 2801 with hysteresis compares a PVTA signal generated by a PVTA signal generator 2802 with the first bit or the second bit, respectively, of a 2-bit read assist reference signal generated by a reference signal generator 2803. The result of the comparison is a 2-bit RAST signal whose bits are supplied to two D-latches 2804, respectively, for controlling a read assist circuit.

Figure 29:
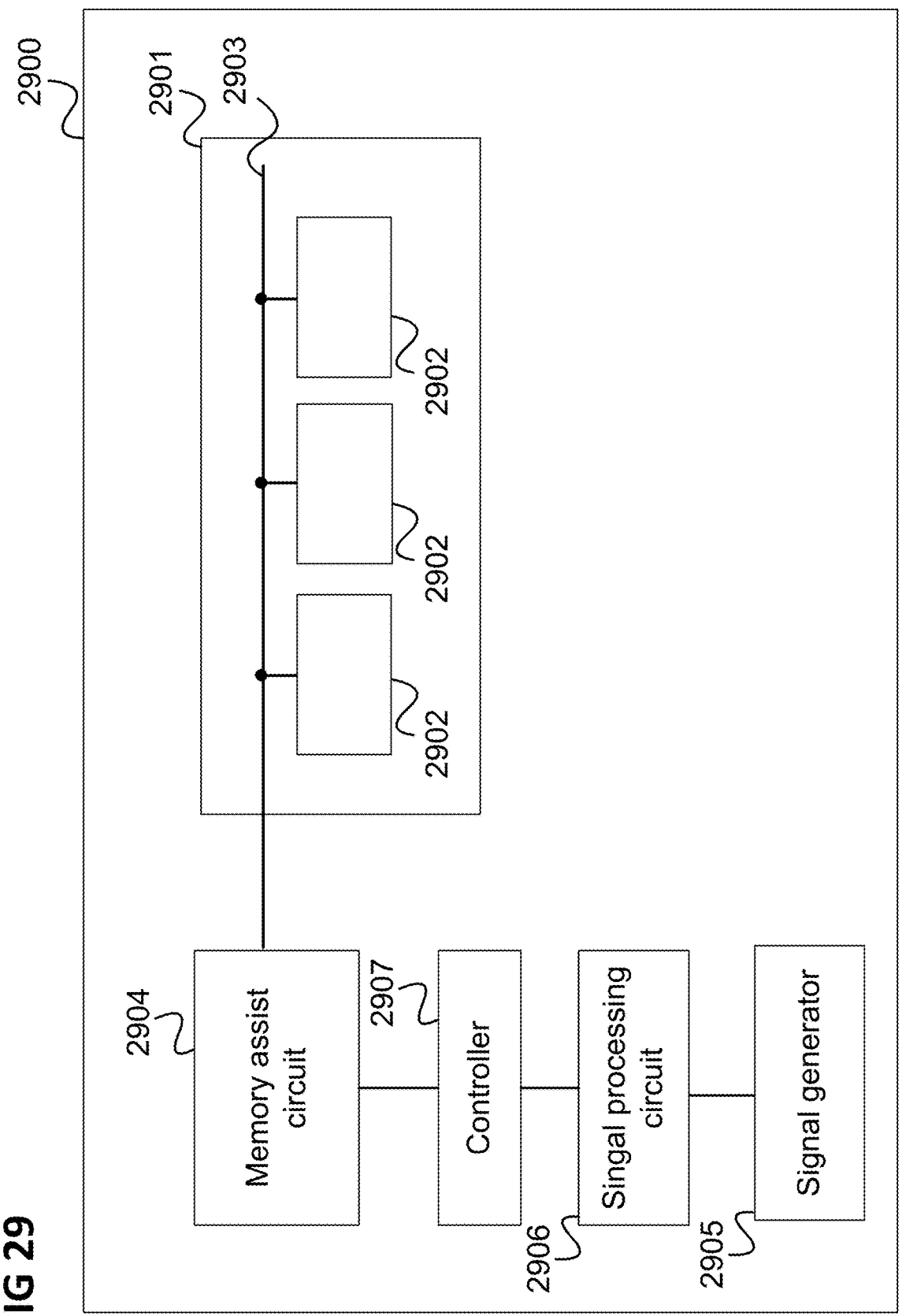
FIG. 29 shows a memory device according to an embodiment.

In summary, according to various embodiments, a memory device is provided as illustrated in FIG. 29.

FIG. 29 shows a memory device 2900 according to an embodiment.

The memory device 2900 includes a memory array 2901 including a plurality of memory cells 2902 wherein each memory cell is coupled to a control line 2903.

Further, the memory device 2900 includes a memory assist circuit 2904 configured to, when activated, apply a reduction of a voltage of the control line 2903.

The memory device 2900 further includes a signal generator 2905 configured to generate a signal representing at least one of a process corner of the memory device 2900, a supply voltage of the memory device 2900, a temperature of the memory device 2900 and an aging of the memory device 2900.

The memory device 2900 further includes a signal processing circuit 2906 configured to amplify the signal and a controller 2907 configured to activate the memory assist circuit 2904 based the amplified signal.

In other words, according to various embodiments, a memory assist circuit such as a WLUD or an NBL assist circuit, is activated based on (e.g. digital) information regarding one or more of a process corner, a supply voltage, a temperature or an aging of the memory device. The memory device may also include a plurality of memory assist circuits which the controller is configured to activate based on the signals and possibly one or more further signals representing at least one of a process corner of the memory device, a supply voltage of the memory device, a temperature of the memory device and an aging of the memory device wherein the memory assist circuits may be configured to apply the same or different memory assist functions. For example, a plurality of memory assist circuits may be provided which apply the same memory assist functions (e.g. WLUD or NBL) but which the controller is configured to activate at different thresholds as in the example of FIG. 7.

Amplifying the signal may for example include supplying the signal to an inverter or in general to the gate of a field effect transistor and using a the inverter output or transistor output as amplified signal, respectively.

The memory device may for example be an SRAM, a Dual-Port SRAM, a Multi-Port SRAM, a DRAM, a flash memory, a resistive RAM, an STT-MRAM, a PC-RAM, a CB-RAM, or a ROM.

For example, the memory device 2900 carries out a method as illustrated in FIG. 11.

Figure 30:
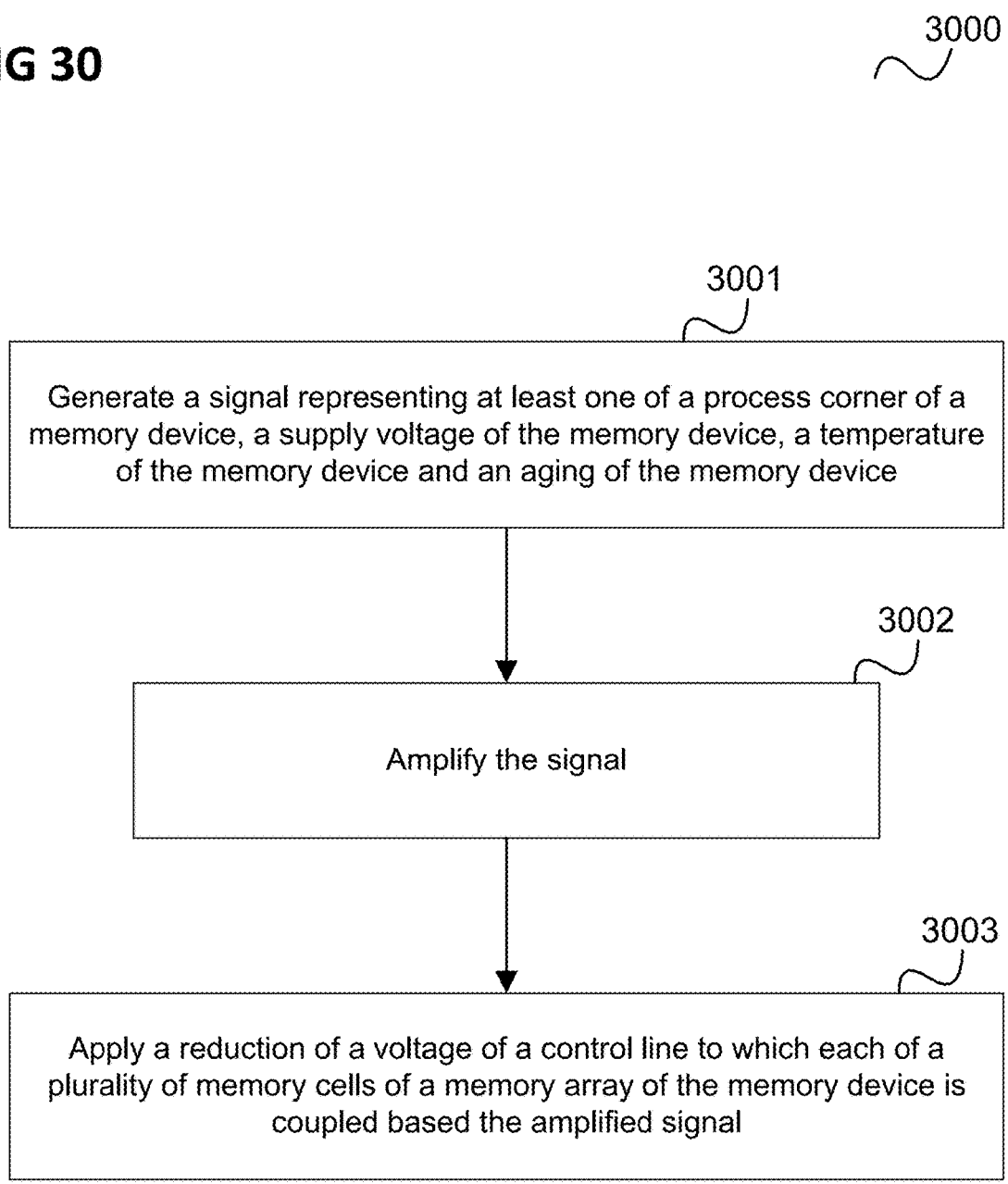
FIG. 30 shows a flow diagram according to an embodiment.

FIG. 30 shows a flow diagram 3000 according to an embodiment.

In 3001, a signal representing at least one of a process corner of a memory device, a supply voltage of the memory device, a temperature of the memory device and an aging of the memory device is generated.

In 3002, the signal is amplified.

In 3003, a reduction of a voltage of a control line to which each of a plurality of memory cells of a memory array of the memory device is coupled is applied.

In the following, various Examples are given.

Example 1 is a memory device as illustrated in FIG. 29.

Example 2 is the memory device of Example 1, wherein the signal represents a combination of at least two of a process corner of the memory device, a supply voltage of the memory device, a temperature of the memory device and an aging of the memory device.

Example 3 is the memory device of Example 1 or 2, wherein the memory device includes a second signal generator configured to generate a second signal representing at least a different one of a process corner of the memory device, a supply voltage of the memory device, a temperature of the memory device and an aging of the memory device than the first signal, wherein the memory device includes a second signal processing circuit configured to amplify the second signal and wherein the controller is configured to activate the memory assist circuit based the amplified first signal and the amplified second signal.

Example 4 is the memory device of any one of Examples 1 to 3, wherein the signal processing circuit is further configured to digitize the amplified signal and the controller is configured to activate the memory assist circuit based on the digitized amplified signal.

Example 5 is the memory device of any one of Examples 1 to 4, wherein the signal generator includes a temperature sensor and wherein the signal represents a temperature of the memory device.

Example 6 is the memory device of any one of Examples 1 to 5, wherein the memory cells include transistors and the signal generator includes a plurality of reference transistors and is configured to generate the signal to represent an aging of the memory device based on a behavior of the reference transistors.

Example 7 is the memory device of any one of Examples 1 to 6, wherein the memory cells include transistors and the signal generator includes a plurality of reference transistors and is configured to generate the signal to represent a process corner of the memory device based on a behavior of the reference transistors.

Example 8 is the memory device of any one of Examples 1 to 7, wherein the process corner includes at least one of a process corner of n channel field effect transistors of the memory device and a process corner of p channel field effect transistors of the memory device.

Example 9 is the memory device of any one of Examples 1 to 8, wherein the memory assist circuit is configured to limit a voltage of the control line when the control line is activated.

Example 10 is the memory device of any one of Examples 1 to 9, wherein the control line is a word line or a bit line.

Example 11 is the memory device of any one of Examples 1 to 9, wherein the control line is a word line and the memory assist circuit is a stability assist circuit.

Example 12 is the memory device of any one of Examples 1 to 9, wherein the control line is a bit line and the memory assist circuit is a writability assist circuit.

Example 13 is the memory device of any one of Examples 1 to 12, wherein each memory cell is coupled to a word line and a bit line.

Example 14 is the memory device of any one of Examples 1 to 13, wherein the supply voltage is a supply voltage of the memory array.

Example 15 is the memory device of any one of Examples 1 to 14, wherein the supply voltage is a supply voltage of the memory array based on which the control line is powered when the control line is activated.

Example 16 is the memory device of any one of Examples 1 to 15, wherein the supply voltage is a high supply potential of the memory array.

Example 17 is the memory device of any one of Examples 1 to 16, wherein the amplified signal represents a digital value and the controller is configured to activate the memory assist circuit based on a comparison of the digital value with a predetermined threshold.

Example 18 is a method for controlling a memory assist function as illustrated in FIG. 30.

Example 19 is the method of Example 18, wherein the signal represents a combination of at least two of a process corner of the memory device, a supply voltage of the memory device, a temperature of the memory device and an aging of the memory device.

Example 20 is the method of Example 18 or 19, including generating a second signal representing at least a different one of a process corner of the memory device, a supply voltage of the memory device, a temperature of the memory device and an aging of the memory device than the first signal, amplifying the second signal and activating the memory assist circuit based the amplified first signal and the amplified second signal.

Example 21 is the method of any one of Examples 18 to 20, including digitizing the amplified signal and activating the memory assist circuit based on the digitized amplified signal.

Example 22 is the method of any one of Examples 18 to 21, including a temperature sensor wherein the signal represents a temperature of the memory device.

Example 23 is the method of any one of Examples 18 to 22, wherein the memory cells include transistors and the method includes generating the signal to represent an aging of the memory device based on a behavior of a plurality of reference transistors.

Example 24 is the method of any one of Examples 18 to 23, wherein the memory cells include transistors and the signal generator includes a plurality of reference transistors and is configured to generate the signal to represent a process corner of the memory device based on a behavior of the reference transistors.

Example 25 is the method of any one of Examples 18 to 24, wherein the process corner includes at least one of a process corner of n channel field effect transistors of the memory device and a process corner of p channel field effect transistors of the memory device.

Example 26 is the method of any one of Examples 18 to 25, including limiting a voltage of the control line when the control line is activated.

Example 27 is the method of any one of Examples 18 to 26, wherein the control line is a word line or a bit line.

Example 28 is the method of any one of Examples 18 to 26, wherein the control line is a word line and the memory assist circuit is a stability assist circuit.

Example 29 is the method of any one of Examples 18 to 26, wherein the control line is a bit line and the memory assist circuit is a writability assist circuit.

Example 30 is the method of any one of Examples 18 to 29, wherein each memory cell is coupled to a word line and a bit line.

Example 31 is the method of any one of Examples 18 to 30, wherein the supply voltage is a supply voltage of the memory array.

Example 32 is the method of any one of Examples 18 to 31, wherein the supply voltage is a supply voltage of the memory array based on which the control line is powered when the control line is activated.

Example 33 is the method of any one of Examples 18 to 32, wherein the supply voltage is a high supply potential of the memory array.

Example 34 is the method of any one of Examples 18 to 33, wherein the amplified signal represents a digital value and the method includes activating the memory assist circuit based on a comparison of the digital value with a predetermined threshold.

According to a further Example, a memory device is provided including a memory array including a plurality of memory cells wherein each memory cell is coupled to bit line and a word line and a memory assist circuit configured to limit a voltage of at least one of the bit line and the word line based on an amplified version of a signal representing at least one of a process corner of the memory device, a supply voltage of the memory device, a temperature of the memory device and an aging of the memory device.

According to a further Example, a memory device is provided including a memory array including a plurality of memory cells wherein each memory cell is coupled to bit line and a word line, a sensor configured to measure at least one of a process corner of the memory device, a supply voltage of the memory device, a temperature of the memory device and an aging of the memory device, an amplifier configured to amplify an output of the sensor and a memory assist circuit configured to reduce a voltage of at least one of the bit line and the word line based on the amplified output of the sensor.

It should be noted that examples described in context of one of the memory devices are analogously valid for the other memory devices and for the method for controlling a memory assist function and vice versa.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A memory device comprising:
a memory array comprising a plurality of memory cells wherein each memory cell is coupled to a control line;
a memory assist circuit configured to, when activated, apply a reduction of a voltage of the control line;
a signal generator configured to generate a first signal representing a process corner of the memory device;
a signal processing circuit configured to amplify the first signal; and
a controller configured to activate the memory assist circuit based on the amplified first signal.

2. The memory device of claim 1, wherein the signal represents a combination of the process corner of the memory device, and at least one of a supply voltage of the memory device, a temperature of the memory device and an aging of the memory device.

3. The memory device of claim 1, wherein the memory device comprises a second signal generator configured to generate a second signal representing at least a different one of a process corner of the memory device, a supply voltage of the memory device, a temperature of the memory device and an aging of the memory device than the first signal, wherein the memory device comprises a second signal processing circuit configured to amplify the second signal and wherein the controller is configured to activate the memory assist circuit based on the amplified first signal and the amplified second signal.

4. The memory device of claim 1, wherein the signal processing circuit is further configured to digitize the amplified signal and the controller is configured to activate the memory assist circuit based on the digitized amplified signal.

5. The memory device of claim 1, wherein the signal generator comprises a temperature sensor and wherein the signal represents a temperature of the memory device.

6. The memory device of claim 1, wherein the memory cells comprise transistors and the signal generator comprises a plurality of reference transistors and is configured to generate the signal to represent an aging of the memory device based on a behavior of the reference transistors.

7. The memory device of claim 1, wherein the memory cells comprise transistors and the signal generator comprises a plurality of reference transistors and is configured to generate the signal to represent a process corner of the memory device based on a behavior of the reference transistors.

8. The memory device of claim 1, wherein the process corner includes at least one of a process corner of n channel field effect transistors of the memory device and a process corner of p channel field effect transistors of the memory device.

9. The memory device of claim 1, wherein the memory assist circuit is configured to limit a voltage of the control line when the control line is activated.

10. The memory device of claim 1, wherein the control line is a word line or a bit line.

11. The memory device of claim 1, wherein the control line is a word line and the memory assist circuit is a stability assist circuit.

12. The memory device of claim 1, wherein the control line is a bit line and the memory assist circuit is a writability assist circuit.

13. The memory device of claim 1, wherein each memory cell is coupled to a word line and a bit line.

14. The memory device of claim 1, wherein the supply voltage is a supply voltage of the memory array.

15. The memory device of claim 1, wherein the supply voltage is a supply voltage of the memory array based on which the control line is powered when the control line is activated.

16. The memory device of claim 1, wherein the supply voltage is a high supply potential of the memory array.

17. The memory device of claim 1, wherein the amplified first signal represents a digital value and the controller is configured to activate the memory assist circuit based on a comparison of the digital value with a predetermined threshold.

18. A method for controlling a memory assist function comprising:
generating a signal representing at least one of a process corner of a memory device, a supply voltage of the memory device, a temperature of the memory device and an aging of the memory device;
amplifying the signal;
digitizing the amplified signal;
activating, a memory assist circuit, based on the digitized amplified signal; and
applying, by the memory assist circuit when activated, a reduction of a voltage of a control line to which each of a plurality of memory cells of a memory array of the memory device is coupled based on the amplified signal.

19. A memory device comprising:
a memory array comprising a plurality of memory cells wherein each memory cell is coupled to a control line;
a memory assist circuit configured to, when activated, apply a reduction of a voltage of the control line;
a signal generator configured to generate a first signal representing at least one of a process corner of the memory device, a supply voltage of the memory device, a temperature of the memory device and an aging of the memory device;
a signal processing circuit configured to amplify the first signal; and
a controller configured to activate the memory assist,
wherein the amplified first signal represents a digital value and the controller is further configured to activate the memory assist circuit based on a comparison of the digital value with a predetermined threshold.

20. A memory device comprising:
a memory array comprising a plurality of memory cells wherein each memory cell is coupled to a control line;
a memory assist circuit configured to, when activated, apply a reduction of a voltage of the control line;
a signal generator configured to generate a first signal representing at least one of a process corner of the memory device, a supply voltage of the memory device, a temperature of the memory device and an aging of the memory device;
a signal processing circuit configured to amplify the first signal; and
a controller configured to activate the memory assist circuit based on the amplified first signal,
wherein the signal processing circuit is further configured to digitize the amplified first signal and the controller is configured to activate the memory assist circuit based on the digitized amplified first signal.

* * * * *